(12) United States Patent
Kim

(10) Patent No.: US 11,031,384 B2
(45) Date of Patent: Jun. 8, 2021

(54) INTEGRATED CIRCUITS AND METHODS OF MANUFACTURING AND DESIGNING THE SAME

(71) Applicant: SAMSUNG ELECTRONICS CO., LTD., Suwon-si (KR)

(72) Inventor: Min-su Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/506,389

(22) Filed: Jul. 9, 2019

(65) Prior Publication Data

US 2020/0185375 A1 Jun. 11, 2020

(30) Foreign Application Priority Data

Dec. 5, 2018 (KR) .......................... 10-2018-0155192

(51) Int. Cl.
| | |
|---|---|
| *H01L 27/02* | (2006.01) |
| *H01L 23/00* | (2006.01) |
| *H01L 23/528* | (2006.01) |
| *G06F 30/39* | (2020.01) |
| *H01L 27/06* | (2006.01) |
| *H01L 27/118* | (2006.01) |

(52) U.S. Cl.
CPC .......... *H01L 27/0207* (2013.01); *G06F 30/39* (2020.01); *H01L 23/528* (2013.01); *H01L 24/43* (2013.01); *H01L 24/49* (2013.01); *H01L 27/0203* (2013.01); *H01L 27/06* (2013.01); *H01L 27/11807* (2013.01)

(58) Field of Classification Search
CPC ..... H01L 27/0207; H01L 24/43; H01L 24/49; H01L 2027/11881; H01L 2027/11875; H01L 27/11807; H01L 23/528
See application file for complete search history.

(56) References Cited

U.S. PATENT DOCUMENTS

| | | |
|---|---|---|
| 8,072,003 B2 | 12/2011 | Becker et al. |
| 9,646,960 B2 | 5/2017 | Baek et al. |

(Continued)

FOREIGN PATENT DOCUMENTS

DE 10 2018 208 142 A1 11/2018

OTHER PUBLICATIONS

Office Action dated Mar. 26, 2021 by the German Patent and Trademark Office in corresponding German Application No. 10 2019 120 292.2.

*Primary Examiner* — Ahmed N Sefer
(74) *Attorney, Agent, or Firm* — Sughrue Mion, PLLC

(57) ABSTRACT

Provided is an integrated circuit including a semiconductor substrate, a plurality of gate lines and a plurality of metal lines. The plurality of gate lines are formed in a gate layer above the semiconductor substrate, where the plurality of gate lines are arranged in a first direction and extend in a second direction perpendicular to the second direction. The plurality of metal lines are formed in a conduction layer above the gate layer, where the plurality of metal lines are arranged in the first direction and extend in the second direction. 6N metal lines and 4N gate lines form a unit wiring structure where N is a positive integer and a plurality of unit wiring structures are arranged in the first direction. Design efficiency and performance of the integrated circuit are enhanced through the unit wiring structure.

18 Claims, 27 Drawing Sheets

(56) References Cited

U.S. PATENT DOCUMENTS

| | | | |
|---|---|---|---|
| 9,899,263 | B2 | 2/2018 | Hsieh et al. |
| 9,972,571 | B1 | 5/2018 | Chen et al. |
| 9,985,014 | B2 | 5/2018 | Xu et al. |
| 2013/0207199 | A1 | 8/2013 | Becker et al. |
| 2014/0175565 | A1* | 6/2014 | Smayling ............ H01L 27/0207 257/401 |
| 2015/0092494 | A1* | 4/2015 | Rhie ...................... G11C 16/14 365/185.12 |
| 2017/0229441 | A1 | 8/2017 | Smayling et al. |
| 2017/0278863 | A1* | 9/2017 | Cha ................... H01L 27/11565 |
| 2018/0174894 | A1 | 6/2018 | Bouche et al. |
| 2018/0175060 | A1 | 6/2018 | Zhu et al. |
| 2018/0226296 | A1 | 8/2018 | Cheng et al. |
| 2019/0035808 | A1* | 1/2019 | Hwang ............. H01L 27/11573 |

* cited by examiner

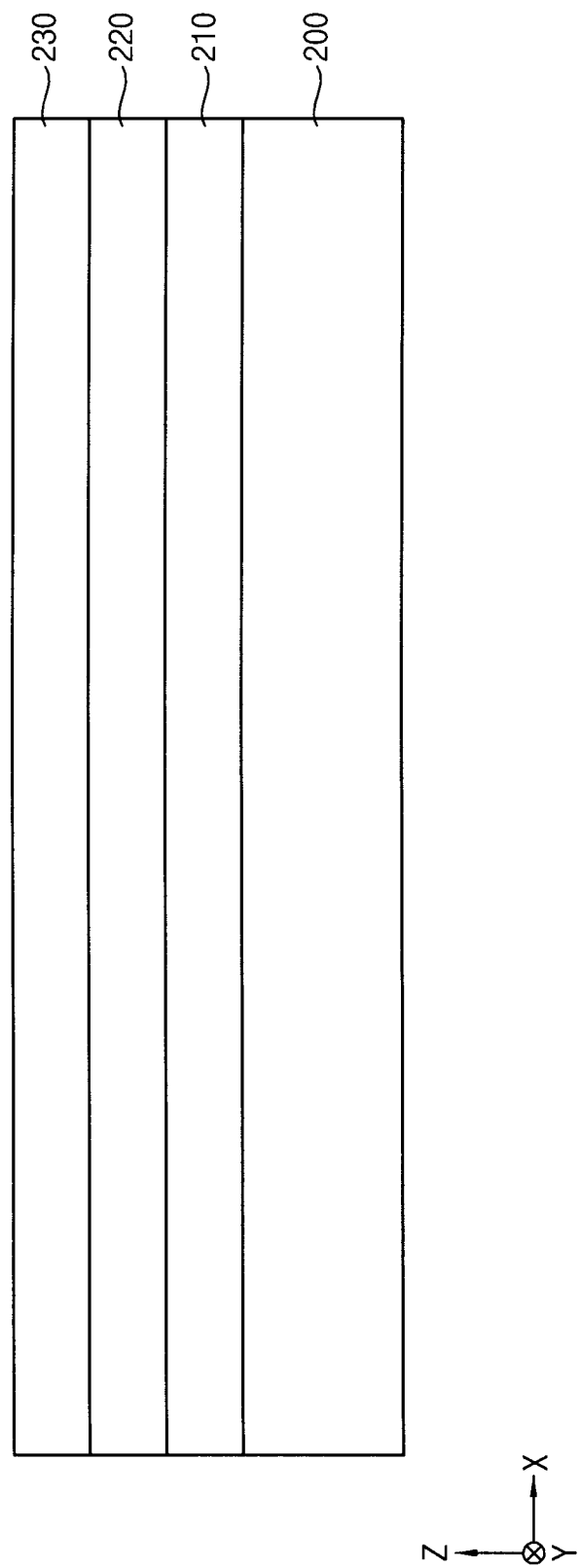

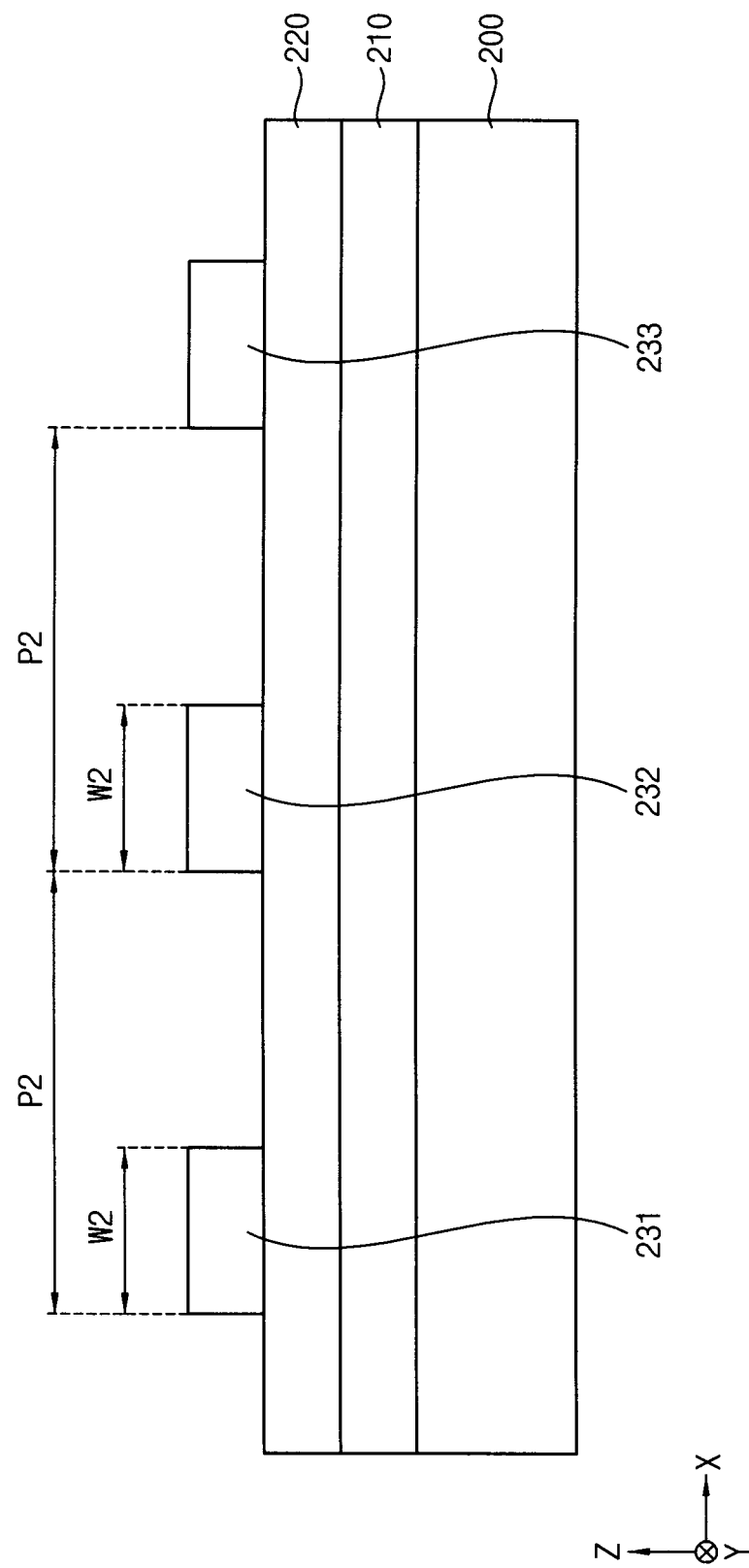

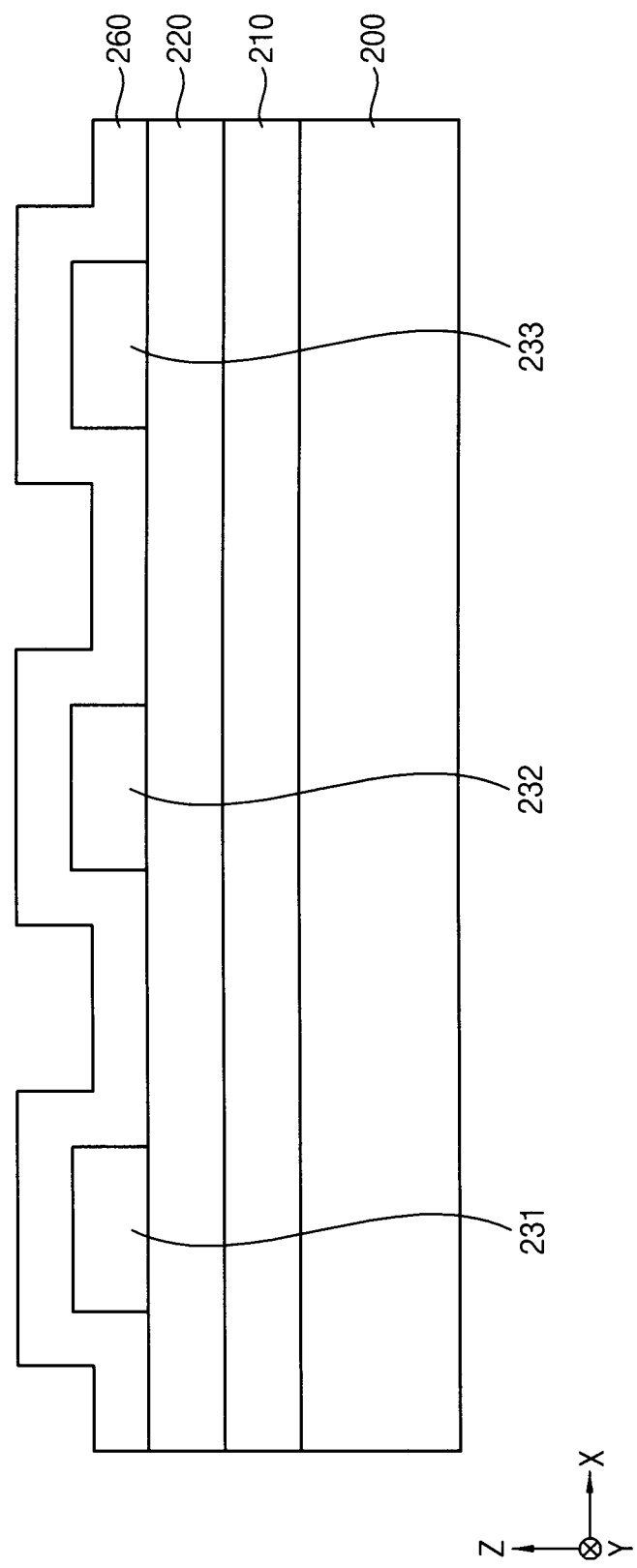

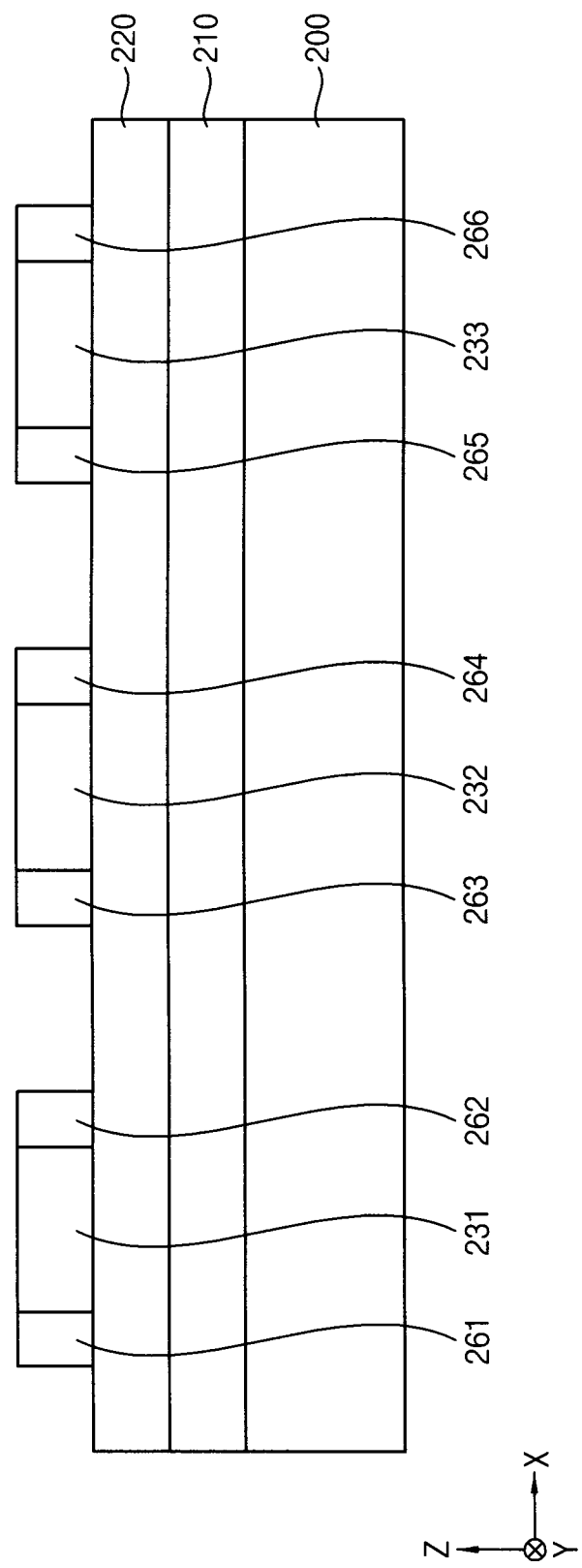

FIG. 12B
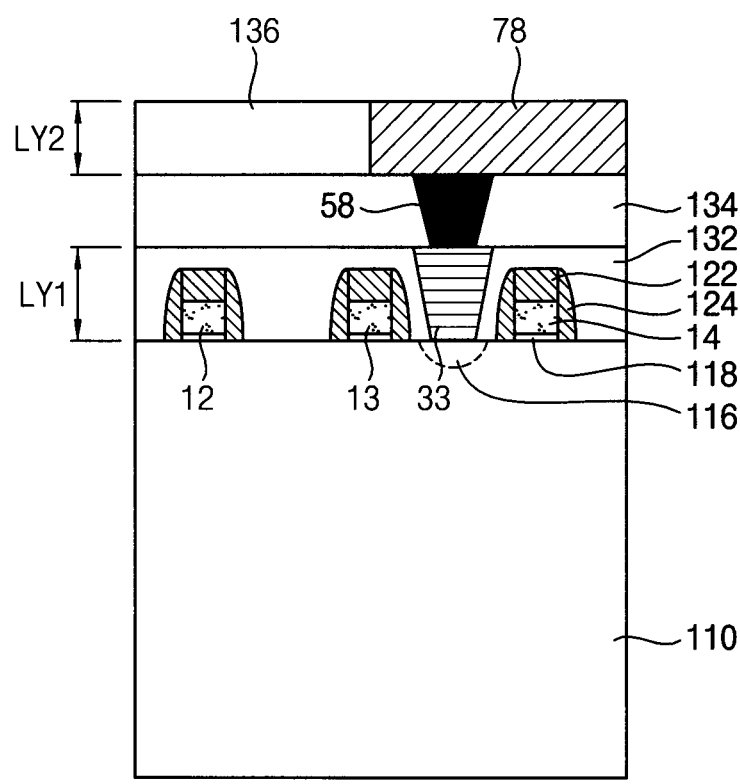
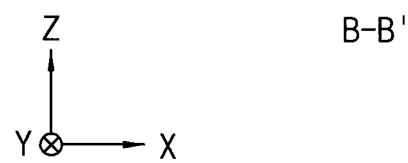
B-B'

INTEGRATED CIRCUITS AND METHODS OF MANUFACTURING AND DESIGNING THE SAME

CROSS-REFERENCE TO RELATED APPLICATION

This U.S. non-provisional application claims priority under 35 USC § 119 to Korean Patent Application No. 10-2018-0155192, filed on Dec. 5, 2018, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to integrated circuits having a unit wiring structure and methods of manufacturing and designing the integrated circuits.

2. Discussion of the Related Art

As Standard cells having fixed functions may be used in the design of integrated circuits. The standard cells have predetermined architectures and are stored in cell libraries. When designing integrated circuits, the standard cells are retrieved from the cell libraries and placed into desired locations on an integrated circuit layout. Routing is then performed to connect the standard cells with each other and with other cells. A standard cell has a predetermined (or set) architecture, e.g., a cell width, a cell height, a cell length, etc. Design efficiency of an integrated circuit may be determined according to configurations and layout of standard cells.

SUMMARY

Some example embodiments may provide an integrated circuit having a wiring structure suitable for designing and methods of manufacturing and designing the integrated circuit.

Also provided is an integrated circuit including: a semiconductor substrate; a plurality of gate lines formed in a gate layer above the semiconductor substrate, the plurality of gate lines arranged in a first direction and extending in a second direction perpendicular to the second direction; and a plurality of metal lines formed in a conduction layer above the gate layer, the plurality of metal lines arranged in the first direction and extending in the second direction, wherein the plurality of metal lines comprise 6N metal lines, the plurality of gate lines comprise 4N gate lines, the 6N metal lines and the 4N gate lines form a unit wiring structure, N is a positive integer, and a plurality of unit wiring structures are arranged in the first direction.

In some embodiments of the integrated circuit, N=1, the plurality of unit wiring structures includes a first unit wiring structure and a second unit wiring structure, the second unit wiring structure is adjacent to the first unit wiring structure in the first direction, and a topography of the second unit wiring structure is the same as a topography of the first unit wiring structure.

In some embodiments of the integrated circuit, two metal pitches between every three metal lines sequentially adjacent in the first direction among the plurality of metal lines are different from each other.

In some embodiments of the integrated circuit, the plurality of metal lines are formed by a self-aligned double patterning (SADP) or a self-aligned quadruple patterning (SAQP).

In some embodiments of the integrated circuit, the plurality of gate lines are formed by a single patterning, the SADP or the SAQP.

In some embodiments of the integrated circuit, the unit wiring structure is a minimum unit structure that is not divided into at least two equal sub wiring structures. Also, in some embodiments, each unit wiring structure comprises six metal lines and four gate lines. In addition, in some embodiments, the six metal lines of each unit wiring structure are formed by a self-aligned double patterning (SADP), and the six metal lines of each unit wiring structure are arranged in the first direction to alternatingly have a first metal pitch and a second metal pitch. Also, in some embodiments, the four gate lines of each unit wiring structure are formed by a single patterning, and the four gate lines of each unit wiring structure are arranged in the first direction to have an equal gate pitch.

In some embodiments generally, four gate lines of each unit wiring structure are formed, for example, by an SADP, and four gate lines of each unit wiring structure are arranged in the first direction to alternatingly have a first gate pitch and a second gate pitch.

In some embodiments generally, four gate lines of each unit wiring structure are formed, for another example, by a self-aligned quadruple patterning (SAQP), and four gate lines of each unit wiring structure are arranged in the first direction to have a first gate pitch, a second gate pitch, the first gate pitch and a third gate pitch sequentially.

In some embodiments, each unit wiring structure comprises twelve metal lines and eight gate lines. Also, in some embodiments, the twelve metal lines of each unit wiring structure are formed by a self-aligned quadruple patterning (SAQP), and the twelve metal lines of each unit wiring structure are arranged in the first direction to have a first metal pitch, a second metal pitch, the first metal pitch and a third metal pitch sequentially and repeatedly. In addition, in some embodiments, the eight gate lines of each unit wiring structure are formed by a single patterning, and the eight gate lines of each unit wiring structure are arranged in the first direction to have an equal gate pitch.

In some embodiments, each unit wiring structure comprises twelve metal lines and eight gate lines, the twelve metal lines of each unit wiring structure are formed by a self-aligned quadruple patterning (SAQP), and the twelve metal lines of each unit wiring structure are arranged in the first direction to have a first metal pitch, a second metal pitch, the first metal pitch and a third metal pitch sequentially and repeatedly. Also, for example, the eight gate lines of each unit wiring structure are formed by a self-aligned double patterning (SADP), and the eight gate lines of each unit wiring structure are arranged in the first direction to alternatingly have a first gate pitch and a second gate pitch.

In yet other embodiments, each unit wiring structure comprises twelve metal lines and eight gate lines, the twelve metal lines of each unit wiring structure are formed by a self-aligned quadruple patterning (SAQP), and the twelve metal lines of each unit wiring structure are arranged in the first direction to have a first metal pitch, a second metal pitch, the first metal pitch and a third metal pitch sequentially and repeatedly. In this embodiment, the eight gate lines of each unit wiring structure are formed by the SAQP, and the eight gate lines of each unit wiring structure are arranged in the first direction to have a first gate pitch, a second gate pitch, the first gate pitch and a third gate pitch sequentially and repeatedly.

Also provided is a method of manufacturing an integrated circuit. The method includes: forming a plurality of gate lines in a gate layer above a semiconductor substrate, the plurality of gate lines arranged in a first direction and extending in a second direction perpendicular to the second direction; and forming a plurality of metal lines in a conduction layer above the gate layer, the plurality of metal lines arranged in the first direction and extending in the second direction, such that 6N metal lines included in the plurality of metal lines and 4N gate lines included in the plurality of gate lines form a unit wiring structure, wherein N is a positive integer and a plurality of unit wiring structures are arranged in the first direction.

In some embodiments of the method, two metal pitches between every three metal lines sequentially adjacent in the first direction among the plurality of metal lines are different from each other.

In some embodiments of the method, the plurality of metal lines are formed by a self-aligned double patterning (SADP) or a self-aligned quadruple patterning (SAQP).

Also in some embodiments of the method, the unit wiring structure is a minimum unit structure that is not divided into at least two equal sub wiring structures.

In addition a method of designing an integrated circuit is provided, including: receiving input data defining an integrated circuit; providing a standard cell library including a plurality of standard cells; performing placement and routing based on the input data and the standard cell library; and generating output data defining the integrated circuit based on a result of the placement and the routing, wherein the integrated circuit includes: a semiconductor substrate, a plurality of gate lines formed in a gate layer above the semiconductor substrate, the plurality of gate lines arranged in a first direction and extending in a second direction perpendicular to the second direction, and a plurality of metal lines formed in a conduction layer above the gate layer, the plurality of metal lines arranged in the first direction and extending in the second direction. In some embodiments of the method, 6N metal lines of the plurality of metal lines and 4N gate lines of the plurality of gate lines form a unit wiring structure, N is a positive integer, and a plurality of unit wiring structures are arranged in the first direction.

According to example embodiments, an integrated circuit includes a semiconductor substrate, a plurality of gate lines and a plurality of metal lines. The plurality of gate lines are formed in a gate layer above the semiconductor substrate, where the plurality of gate lines are arranged in a first direction and extend in a second direction perpendicular to the second direction. The plurality of metal lines are formed in a conduction layer above the gate layer, where the plurality of metal lines are arranged in the first direction and extend in the second direction. 6N metal lines and 4N gate lines form a unit wiring structure where N is a positive integer and a plurality of unit wiring structures are arranged in the first direction.

According to example embodiments, a method of manufacturing an integrated circuit, includes, forming a plurality of gate lines in a gate layer above a semiconductor substrate, the plurality of gate lines arranged in a first direction and extending in a second direction perpendicular to the second direction, and forming a plurality of metal lines in a conduction layer above the gate layer, the plurality of metal lines arranged in the first direction and extending in the second direction, such that 6N metal lines and 4N gate lines form a unit wiring structure where N is a positive integer and a plurality of unit wiring structures are arranged in the first direction.

According to example embodiments, a method of designing an integrated circuit, includes, receiving input data defining an integrated circuit, providing a standard cell library including a plurality of standard cells, performing placement and routing based on the input data and the standard cell library and generating output data defining the integrated circuit based on a result of the placement and the routing, The integrated circuit includes a semiconductor substrate, a plurality of gate lines formed in a gate layer above the semiconductor substrate, the plurality of gate lines arranged in a first direction and extending in a second direction perpendicular to the second direction and a plurality of metal lines formed in a conduction layer above the gate layer, the plurality of metal lines arranged in the first direction and extending in the second direction, wherein 6N metal lines and 4N gate lines form a unit wiring structure where N is a positive integer and a plurality of unit wiring structures are arranged in the first direction.

The integrated circuit and the method of manufacturing and designing the integrated circuit according to example embodiments may enhance design efficiency and performance of the integrated circuit through the unit wiring structure.

BRIEF DESCRIPTION OF THE DRAWINGS

Example embodiments of the present disclosure will be more clearly understood from the following detailed description taken in conjunction with the accompanying drawings.

FIGS. 4A through 4I are diagrams for describing patterning processes for manufacturing an integrated circuit according to example embodiments.

FIGS. 12A, 12B and 12C are cross-sectional views of the standard cell of FIG. 11.

DETAILED DESCRIPTION OF THE EMBODIMENTS

Figure 1:
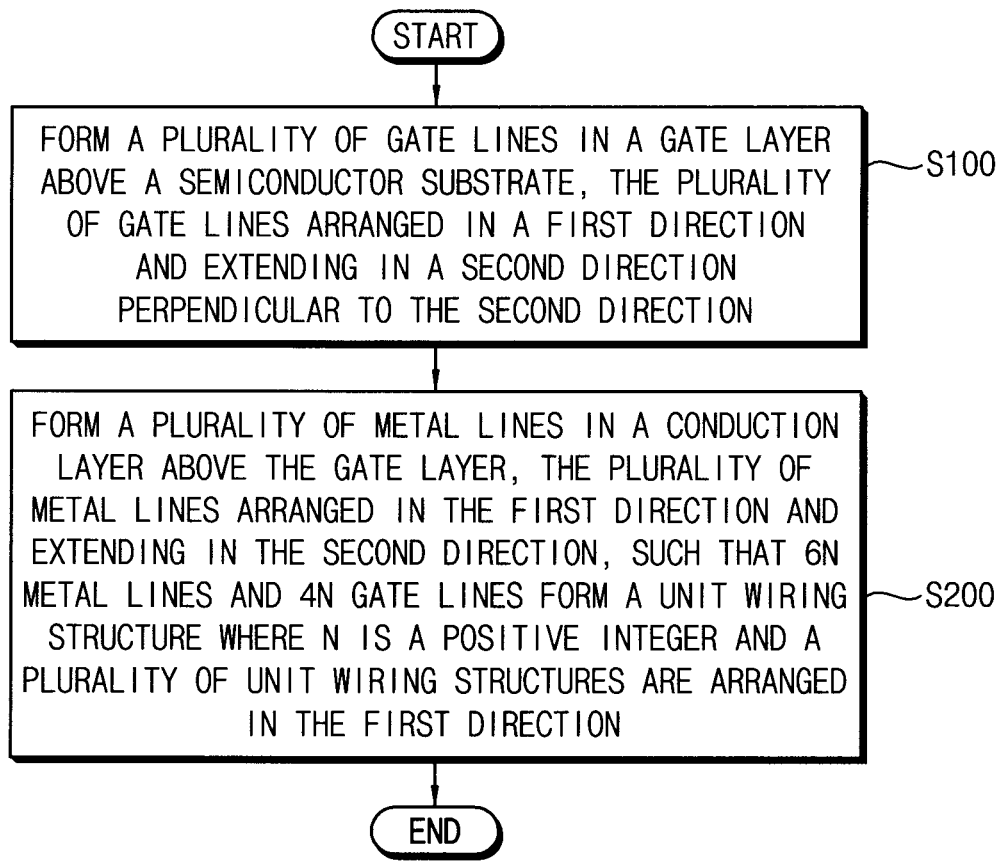
FIG. 1 is a flow chart illustrating a method of manufacturing an integrated circuit.

Various example embodiments will be described more fully hereinafter with reference to the accompanying drawings, in which some example embodiments are shown. In the drawings, like numerals refer to like elements throughout. The repeated descriptions may be omitted.

Hereinafter, structures of an integrated circuit according to example embodiments are described using a first direction X, a second direction Y, and a third direction Z in a three-dimensional space. The first direction X may be a row direction, the second direction Y may be a column direction, and the third direction Z may be a vertical direction. The first direction X, the second direction Y, and the third direction Z may intersect, e.g., may be orthogonal or perpendicular to one another.

FIG. 1 is a flow chart illustrating a method of manufacturing an integrated circuit.

Referring to FIG. 1, a plurality of gate lines are formed in a gate layer above a semiconductor substrate where the plurality of gate lines are arranged in a first direction and extend in a second direction perpendicular to the first direction (S100). A plurality of metal lines are formed in a conduction layer above the gate layer where the plurality of metal lines are arranged in the first direction and extend in the second direction, such that 6N metal lines and 4N gate lines form a unit wiring structure where N is a positive integer and a plurality of unit wiring structures are arranged in the first direction (S200).

According to example embodiments, the plurality of metal lines may be formed by a self-aligned double patterning (SADP) or a self-aligned quadruple patterning (SAQP). SADP and SAQP are fabrication techniques. In addition, according to example embodiments, the plurality of gate lines may be formed by a single patterning (i.e., a direct patterning), the SADP or the SAQP. Single patterning is also a fabrication technique. The single patterning, the SADP and the SAQP will be described below with reference to FIGS. 4A through 4I.

The unit wiring structure, in some embodiments, corresponds to a minimum unit structure that is not divided into at least two equal sub wiring structures. In some example embodiments, each unit wiring structure may include six metal lines and four gate lines. In this case, the unit wiring structure is not divided into two sub wiring structures such that each sub wiring structure includes three metal lines and two gate lines. In some example embodiments, each unit wiring structure may include twelve metal lines and eight gate lines. In this case, the unit wiring structure is not divided into four sub wiring structures such that each sub wiring structure includes three metal lines and two gate lines and the unit wiring structure is not divided into two sub wiring structures such that each sub wiring structure includes six metal lines and four gate lines.

As semiconductor processes are scaled down, the number of transistors integrated in one integrated circuit increases exponentially. Due to the large number of transistors, integrated circuits are designed using a standard cell library that includes a plurality of standard cells standardizing logic gates, rather than customized designing. The complicated integrated circuit implementing desired functions may be designed automatically through a standard cell library, a logic synthesizing tool and an automatic placement and routing tool.

The standard cells are arranged to form a plurality of rows for the automatic design and the rows of the manufactured integrated circuit has regular pitches except optical deviations. The gate lines of the integrated circuit extend in the column direction and are arranged in the row direction repeatedly. The metal lines above the gate lines transfer signals and/or voltages bi-directionally or uni-directionally. Usually the metal lines in the upper layer are implemented as being uni-directional.

The gate lines and the metal lines are very dense and the pitches of the gate lines and the metal lines act as a limit of patterns in a lithograph process. If the pitch of the metal lines arranged in the same direction as the gate lines is different from the pitch of the gate lines, some metal tracks are unusable due to aliasing caused by the different pitches and the design is restricted.

To solve such problems, example embodiments provide efficient wiring structures of the gate lines and the metal lines extending in the same direction so as to maximize resources of the gate lines and the metal lines provided in the manufacturing processes. The integrated circuit and the method of manufacturing and designing the integrated circuit according to example embodiments may enhance design efficiency and performance of the integrated circuit through the unit wiring structure.

The above-described conduction layer may be referred to as a column conduction layer and the above-described metal lines may be referred to as column metal lines. The column metal lines may be the metal lines extending in a certain direction, for example, in the second direction and "column" is not limited to a particular direction.

Figure 2:
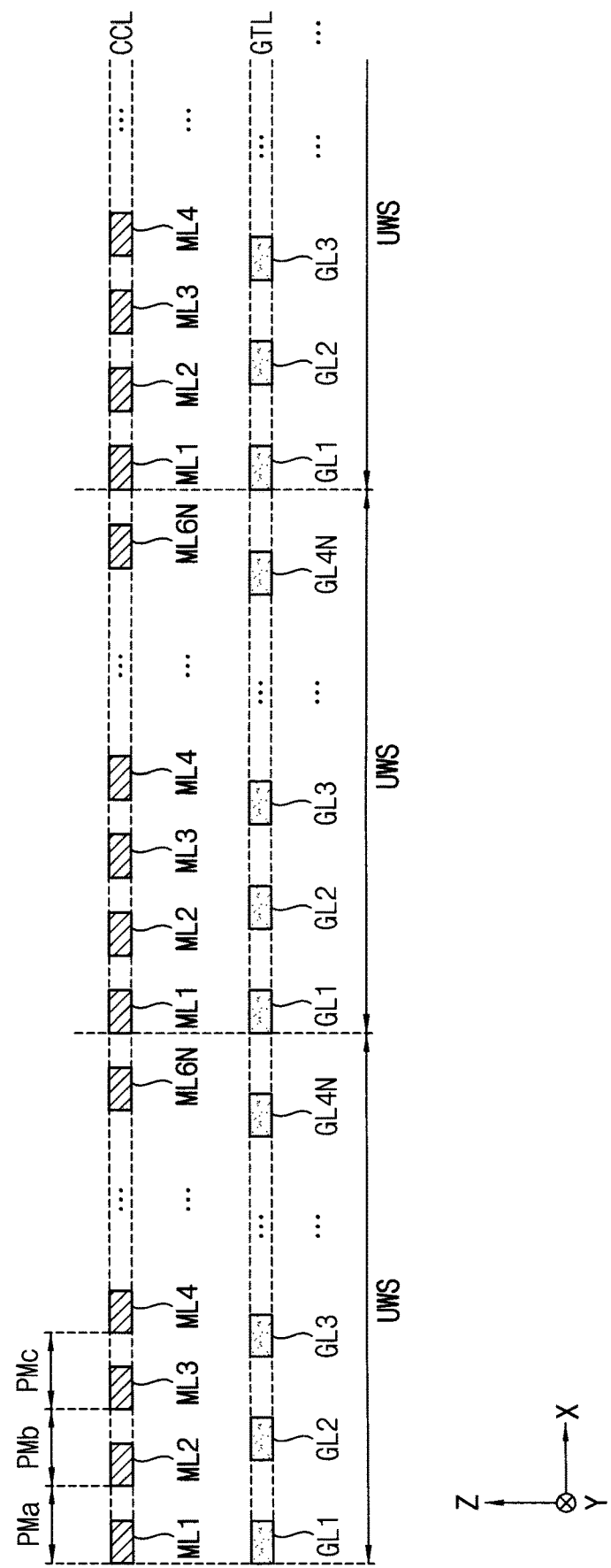
FIG. 2 is a cross-sectional view of an integrated circuit according to example embodiments.
Figure 3:
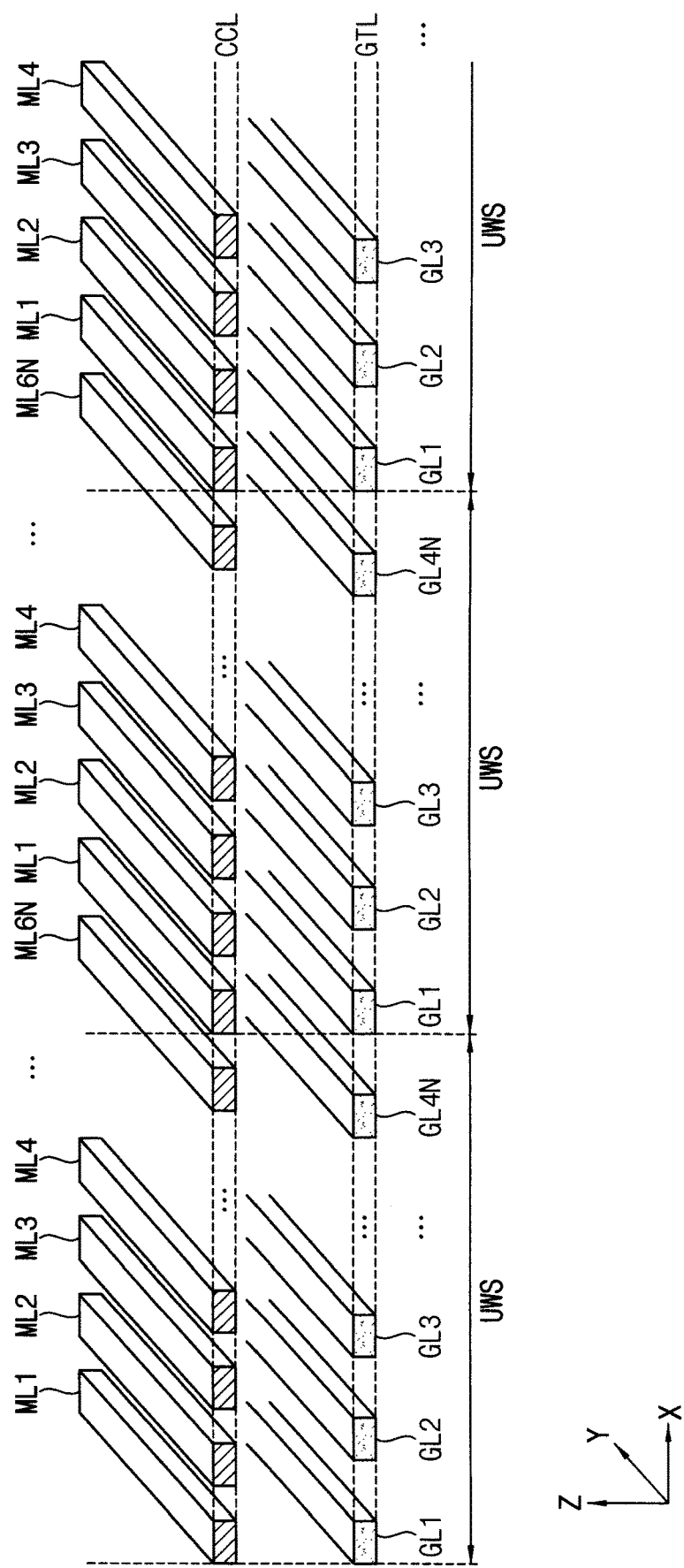
FIG. 3 is a perspective view of an integrated circuit according to example embodiments.

FIG. 2 is a cross-sectional view of an integrated circuit according to example embodiments, and FIG. 3 is a perspective view of an integrated circuit according to example embodiments.

Referring to FIGS. 2 and 3, an integrated circuit includes a semiconductor substrate (not shown), a plurality of gate lines GL1~GL4N and a plurality of metal lines ML1~ML6N.

The plurality of gate lines GL1~GL4N are formed in a gate layer GTL above the semiconductor substrate. The plurality of gate lines GL1~GL4N are arranged in a first direction X and extend in a second direction Y perpendicular to the second direction X. The plurality of metal lines ML1~ML6N are formed in a column conduction layer CCL above the gate layer GTL. The plurality of metal lines ML1~ML6N are arranged in the first direction X and extend in the second direction Y. At least one of the gate lines GL1~GL4N may be cut into gate segments and/or the at least one of the metal lines ML1~ML may be cut into metal segments.

As illustrated in FIGS. 2 and 3, 6N metal lines ML1~ML6N and 4N gate lines GL1~GL4N may form a unit wiring structure UWS and a plurality of unit wiring structures UWS may be arranged in the first direction X.

Two metal pitches between every three metal lines sequentially adjacent in the first direction X among the plurality of metal lines ML1~ML6N may be different from each other. For example, a first metal pitch PMa and a second metal pitch PMb between the first metal line ML1, the second metal line ML2 and the third metal line ML3 adjacent in the first direction X may be different from each other. In the same way, the second metal pitch PMb and a third metal pitch PMc between the second metal line ML2, the third metal line ML3 and the fourth metal line ML4 adjacent in the first direction X may be different from each other. The first metal pitch PMa and the third metal pitch PMc may be equal to or different from each other.

In some example embodiments, each unit wiring structure UWS may include six metal lines and four gate lines. In this case, the six metal lines of each unit wiring structure UWS may be formed by the SADP. Example embodiments by the SADP will be described below with reference to FIGS. 5, 6 and 7.

In some example embodiments, each unit wiring structure UWS may include twelve metal lines and eight gate lines. In this case, the twelve metal lines of each unit wiring structure UWS may be formed by the SAQP. Example embodiments by the SAQP will be described below with reference to FIGS. 8, 9 and 10.

In general, a plurality of conduction layers may be arranged above the gate layer GTL. At least one conduction layer in which wiring patterns are formed may be inserted between the gate layer GTL and the column conduction layer CCL, and or at least one conduction may be disposed above the column conduction layer CCL. In some example embodiments, the integrated circuit may further include a plurality of row metal lines formed in a row conduction layer between the gate layer GTL and the column conduction layer CCL such that the row metal lines are arranged in the second direction Y and extend in the first direction X. The conduction layers disposed sequentially above the gate layer GTL may be referred to as an M1 layer, an M2 layer, an M3 layer, an M4 layer and so on. The row conduction layer may correspond to the M1 layer or the M2 layer, and the column conduction layer CCL may correspond to the M2 layer or the M3 layer.

FIGS. 4A through 4I are diagrams for describing patterning processes for manufacturing an integrated circuit according to example embodiments.

The pitches of the unit wiring structure associated with the single patterning, the SADP and the SAQP may be described with reference to FIGS. 4A through 4I. The mandrel spacer patterning is described with reference to FIGS. 4A through 4I as an example, but example embodiments are not limited to particular patterning processes.

In this disclosure, the single patterning, the SADP and the SAQP are defined as follows. The single patterning or the direct patterning indicates forming target patterns having the same average pitch as exposed patterns in the lithograph process. Here the target patterns include the gate lines and the column metal lines included in the unit wiring structure according to example embodiments. The SADP indicates forming target patterns having an average pitch corresponding to a ½ average pitch of the exposed patterns. The SAQP indicates forming target patterns having an average pitch corresponding to a ¼ average pitch of the exposed patterns.

Referring to FIG. 4A, intermediate layers 210, 220 and 230 are formed over a semiconductor substrate 200. The semiconductor substrate 200 includes silicon as a semiconductor wafer. In various embodiments, the substrate 200 may include another elementary semiconductor, such as germanium; a compound semiconductor such as silicon carbide, gallium arsenide, gallium phosphide, indium phosphide, indium arsenide, and/or indium antimonide; an alloy semiconductor such as GaAsP, AlInAs, AlGaAs, InGaAs, GaInP, and/or GaInAsP, or combinations thereof.

The substrate 200 may include active regions, epitaxial features, isolation structures, fin-like semiconductor regions, and/or other suitable features. In some example embodiments, the substrate 200 includes a polysilicon layer, which may be used for forming polysilicon gate electrodes or for forming dummy gate electrodes in a gate-replacement process.

The intermediate layers 210, 220, and 230 may be dielectric layers that may be formed by one or more deposition techniques, such as thermal oxidation, chemical vapor deposition (CVD), physical vapor deposition (PVD), plasma-enhanced CVD (PECVD), and atomic layer deposition (ALD).

Figure 4B:
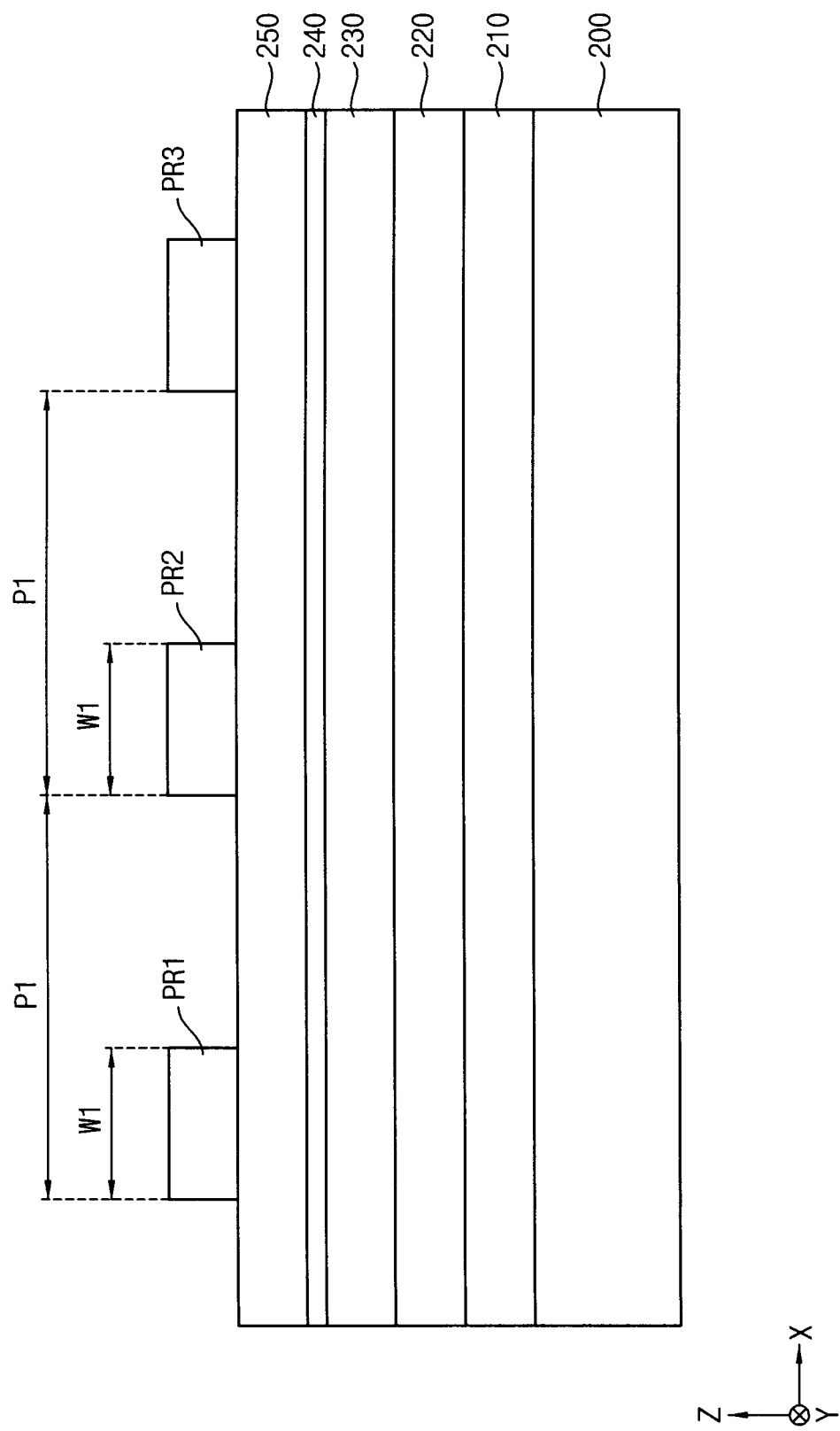

Referring to FIG. 4B, photoresist (or resist pattern) PR1, PR2 and PR3 are patterned over layers 240 and 250 which are disposed over the dielectric layer 230. For example, the layer 250 may be a silicon-containing hard mask layer and the layer 240 may be an anti-reflective coating layer. The layers 240 and 250 may be formed using CVD, PVD, or other suitable methods. In some example embodiments, the resist pattern PR1, PR2 and PR3 may be formed directly over the dielectric layer 230 without the layers 240 and 250.

The resist patterns PR1, PR2 and PR3 may be formed using a photolithography process. For example, a resist layer is formed on the layer 250 using a spin-coating process and soft baking process. Then, the resist layer is exposed to a radiation using a mask having the definitions for first mandrel patterns 231, 232 and 233 of FIG. 4C. The first mandrel patterns 231, 232 and 233 will provide a basis to create sidewalls upon 231, 232, and 233. The first mandrel patterns 231, 232, and 233 will eventually be etched away. The exposed resist layer is developed using post-exposure baking, developing, and hard baking thereby forming the resist patterns PR1, PR2 and PR3 over the layer 250. The resist patterns PR1, PR2 and PR3 have a pitch P1 and a width W1 in the first direction X.

Referring to FIG. 4C, the layers 250, 240, and 230 are etched through the openings of the resist patterns PR1, PR2 and PR3 to form the first mandrel patterns 231, 232 and 233. The etching process may include a dry (or plasma) etching, a wet etching, or other suitable etching methods. The resist patterns PR1, PR2 and PR3 are removed thereafter using a suitable process, such as wet stripping or plasma ashing. The layers 250 and 240 are also removed using one or more of the etching processes, resulting in the first mandrel patterns 231, 232 and 233 over the intermediate layer 220 as shown in FIG. 4C. The first mandrel patterns 231, 232 and 233 have a pitch P2 and a width W2 in the first direction X, which substantially match the pitch P1 and the width W1 respectively, with the consideration of feature variation through the above patterning processes.

Referring to FIG. 4D, a first spacer layer 260 is formed over the dielectric layer 220, over the first mandrel patterns 231, 232 and 233, and onto sidewalls of the first mandrel patterns 231, 232 and 233. The first spacer layer 260 is disposed over the dielectric layer 220 and the first mandrel patterns 231, 232 and 233. The first spacer layer 260 includes one or more materials different from the dielectric layer 220 and the first mandrel patterns 231, 232 and 233 so that the first spacer layer 260 has different etching selectivity with respect to an etching process. The first spacer layer 260 may be formed by a CVD process, a PVD process, an atomic layer deposition (ALD) process, or other suitable deposition techniques.

Figure 4F:
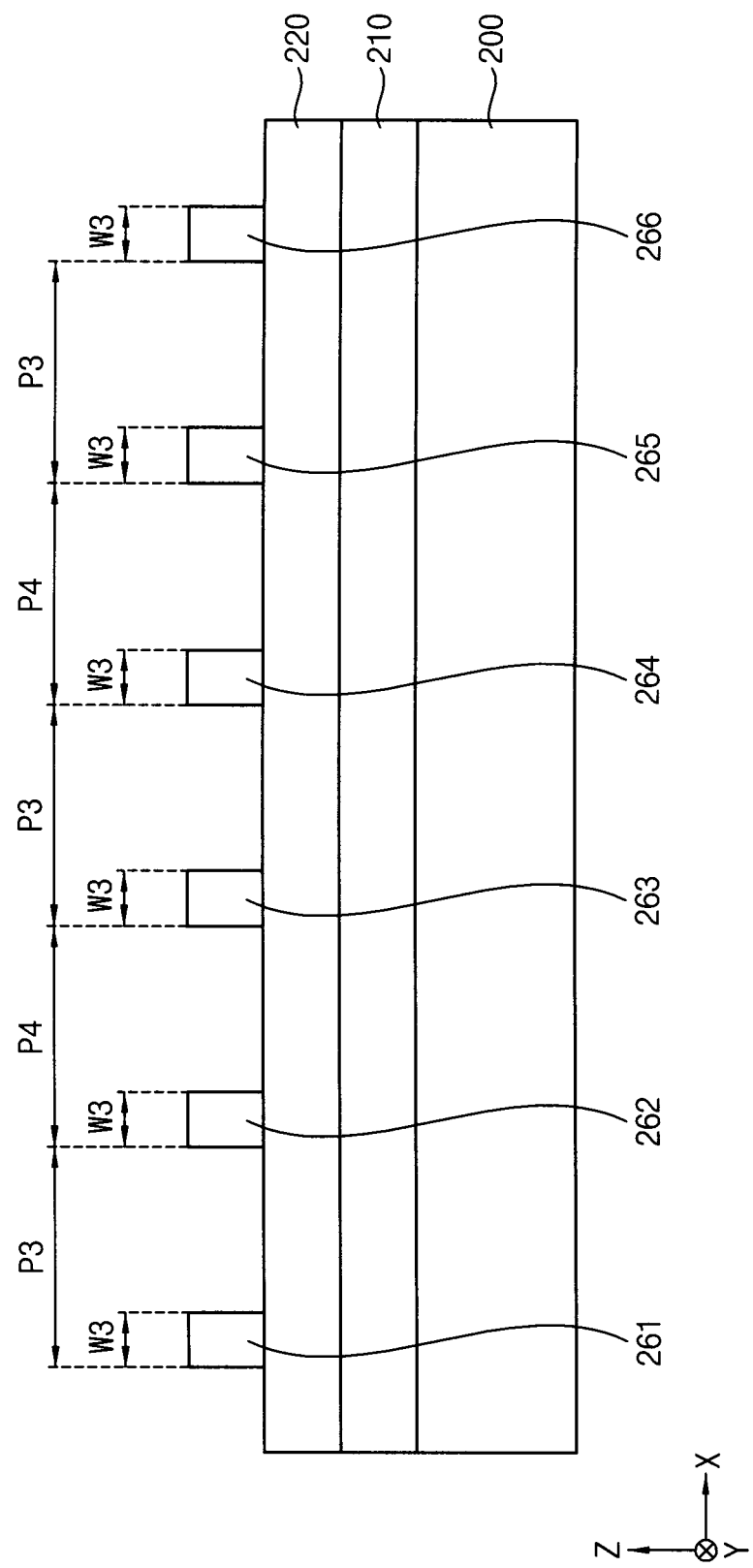

Referring to FIG. 4E, an etching process is performed with respect to the first spacer layer 260, and thus first sidewall spacers 261~266 are defined. The first sidewall spacer 261 may be referred to herein as a second mandrel pattern (similarly 262-266). As shown in FIG. 4E, the first mandrel pattern 231 is present before the etching. The result after etching away the first mandrel pattern 231 is shown in FIG. 4F, in which, for example, the sidewalls 261 and 262 remain. The pitch (also called, in some embodiments, distance, spacing, resolution, feature resolution or feature separation distance) obtained between 261 and 262, in some embodiments, is smaller or more precise than the pitch obtainable with the lithography which provided resist features PR1, PR2, and PR3 of FIG. 4B.

Referring to FIG. 4F, an etching process of a suitable etching selectivity is performed to remove the first mandrel patterns 231, 232 and 233 and the first sidewall spacers 261~266 remain. 261 was formed as a sidewall and will, in some embodiments, be etched away in a later process step, thus it is a spacer. Overall, 261 may be referred to as a sidewall spacer. The first sidewall spacers 261~266 have pitches P3 and P4 and a width W3 in the first direction X. The pitch P3 of the two sidewall spacers (e.g., the sidewall spacers 261 and 262) corresponding to one mandrel pattern may be equal to or different from the pitch P4 of the two opposing sidewall spacers (e.g., the sidewall spacers 262 and 263) of the two adjacent mandrel patterns. In some embodiments, the average pitch of the first sidewall spacers 261~266 is decreased to the ½ average pitch of the resist patterns PR1, PR2 and PR3.

Figure 4G:
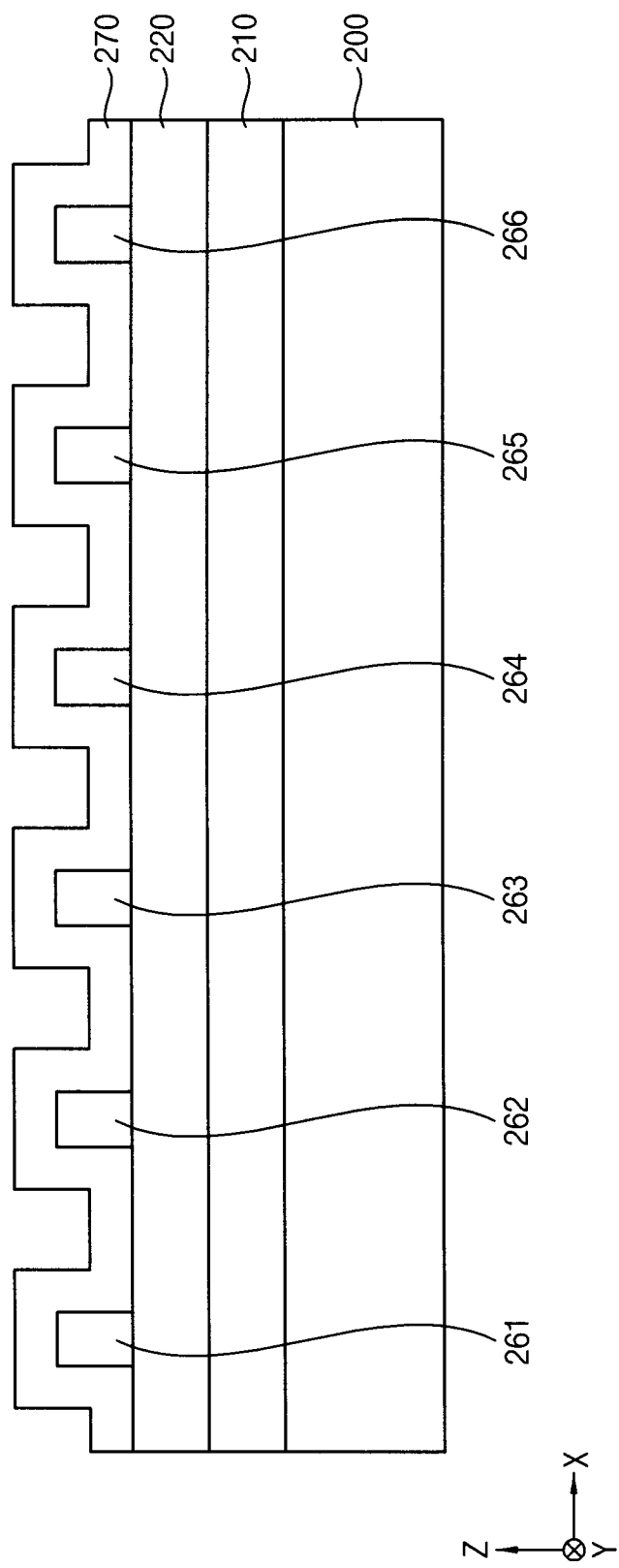

In some embodiments, a sequence of applying a space layer and repeated etching steps may be applied with the structure of FIG. 4F as a starting point. Referring to FIG. 4G, a second spacer layer 270 can be formed over the dielectric layer 220, over the first sidewall spacers 261~266, and onto sidewalls of the first sidewall spacers 261~266. In other words, the first sidewall spacers 261~266 may be used as second mandrel patterns. In some embodiments, 261~266 have been fabricated to accept material deposition, and then 261~266 will later be etched away leaving the deposited material in place. The second spacer layer 270 is disposed over the dielectric layer 220 and the first sidewall spacers 261~266. The second spacer layer 270 includes one or more materials different from the dielectric layer 220 and the first sidewall spacers 261~266 so that the second spacer layer 270 has different etching selectivity with respect to an etching process. The second spacer layer 270 may be formed by a CVD process, a PVD process, an ALD process, or other suitable deposition techniques.

Figure 4H:
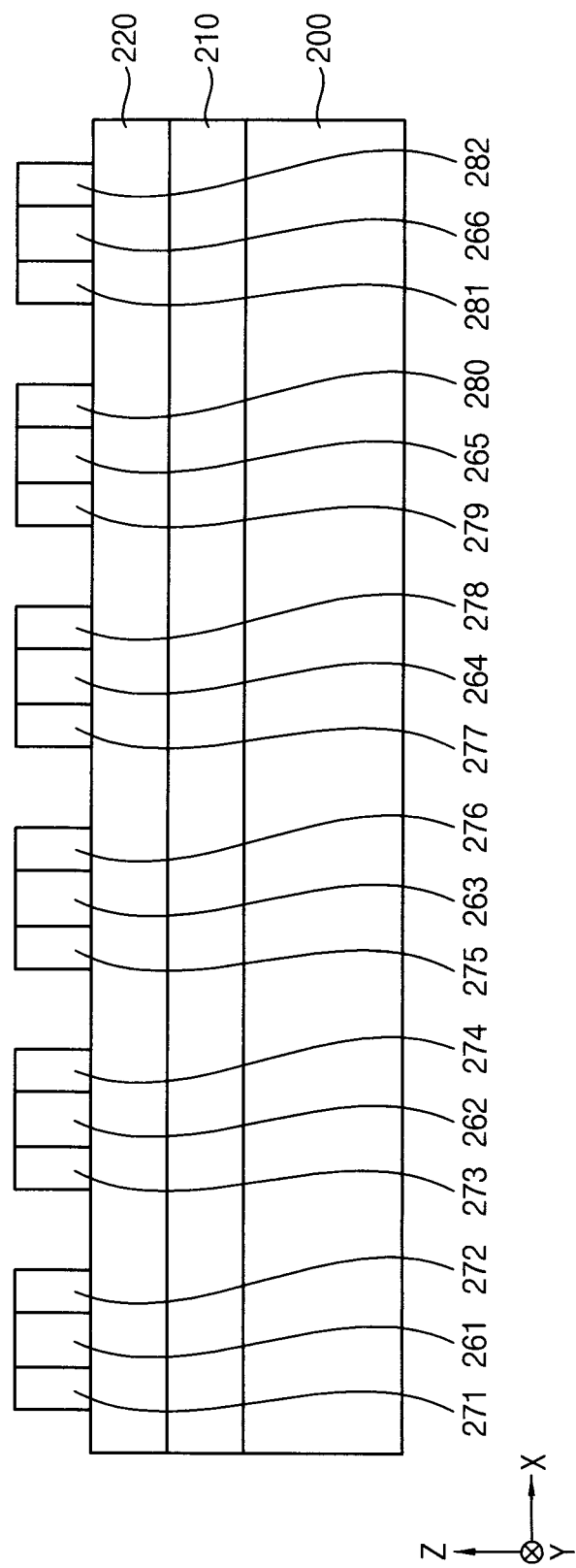
Figure 41:
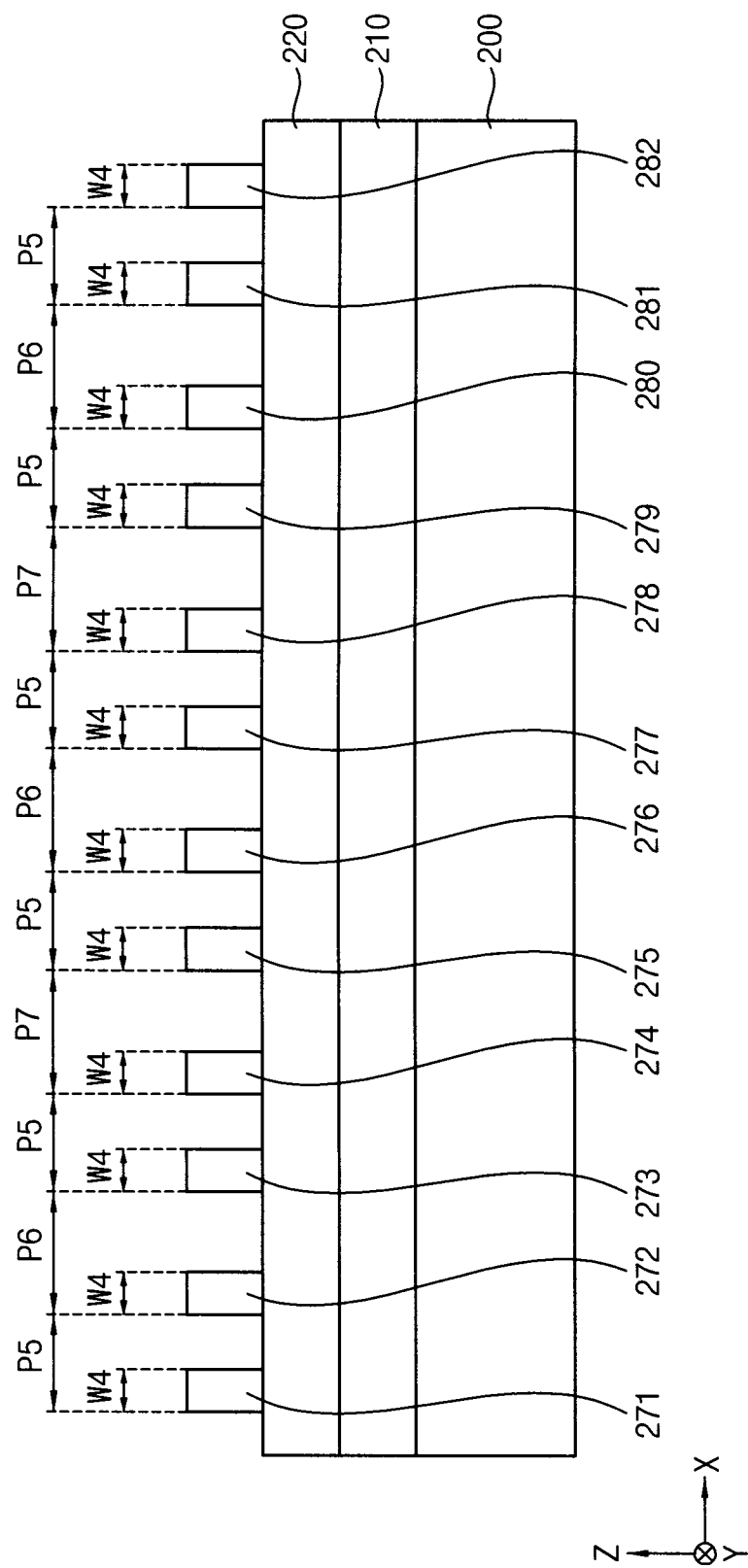

Referring to FIG. 4H, an etching process is performed with respect to the second spacer layer 270, and thus second sidewall spacers 271~282 are defined.

Referring to FIG. 4I, an etching process of a suitable etching selectivity is performed to remove the first sidewall spacers 261~266 and the second sidewall spacers 271~282 remain. The second sidewall spacers 271~282 have pitches P5, P6 and P7 and a width W4 in the first direction X. The pitches P5, P6 and P7 are determined depending on the width W3 of the first sidewall spacers 261~266 and the width W4 of the second sidewall spacers 271~282. In some embodiments, the average pitch of the second sidewall spacers 271~282 is decreased to the ¼ average pitch of the resist patterns PR1, PR2 and PR3.

In some example embodiments, as described with reference to FIGS. 4G, 4H and 4I, the second sidewall spacers 271~282 may be formed in the same layer as the first sidewall spacers 261~266, using the first sidewall spacers 261~266 as the mandrel patterns.

In some example embodiments, even though not illustrated in figures, the first sidewall spacers 261~266 may be printed in the lower layer, and the second sidewall spacers 271~282 may be formed in the layer lower than the first sidewall spacers 261~266, using the printed patterns as the mandrel patterns.

Depending on the number of process steps used, different pitch values (feature resolution or feature separation distances) are obtained. In case of the single patterning or the direct patterning, the target patterns having the same average pitch as the resist patterns PR1, PR2 and PR3 may be formed using the resist patterns PR1, PR2 and PR3. In case of the SADP, the target patterns having the ½ average pitch of the resist patterns PR1, PR2 and PR3 may be formed in the layer lower than the resist patterns PR1, PR2 and PR3 using the first mandrel patterns 231, 232 and 233. In case of the SAQP, the target patterns having the ¼ average pitch of the resist patterns PR1, PR2 and PR3 may be formed in the layer lower than the resist patterns PR1, PR2 and PR3 using the first sidewall patterns 261~266 as the second mandrel patterns.

FIGS. 5 through 10 are diagrams illustrating example embodiments of a unit wiring structure applied to an integrated circuit.

For convenience of description, patterns DPM, QPM, DPG and QPG formed in sacrificial layers are illustrated additionally in FIGS. 5 through 10. The patterns DPM, QPM, DPG and QPG may correspond to the mandrel patterns as described with reference to FIGS. 4A through 4I and may be removed during intermediate processes to be excluded in the final integrated circuit.

Hereinafter, example embodiments of forming a plurality of column metal lines by the SADP will be described with reference to FIGS. 5, 6 and 7.

Figure 5:
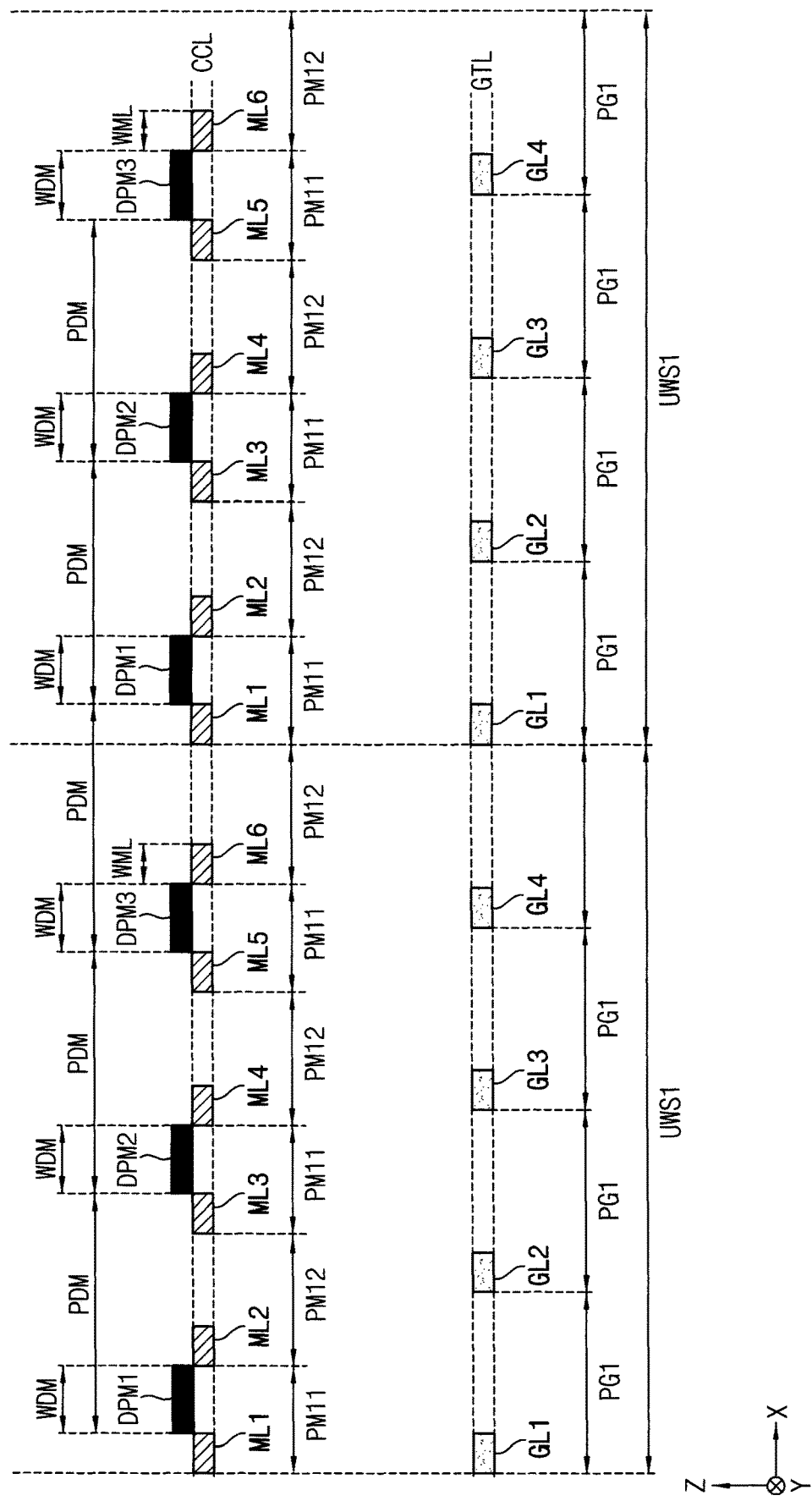
FIGS. 5 through 10 are diagrams example embodiments of a unit wiring structure applied to an integrated circuit according to example embodiments.
Figure 6:
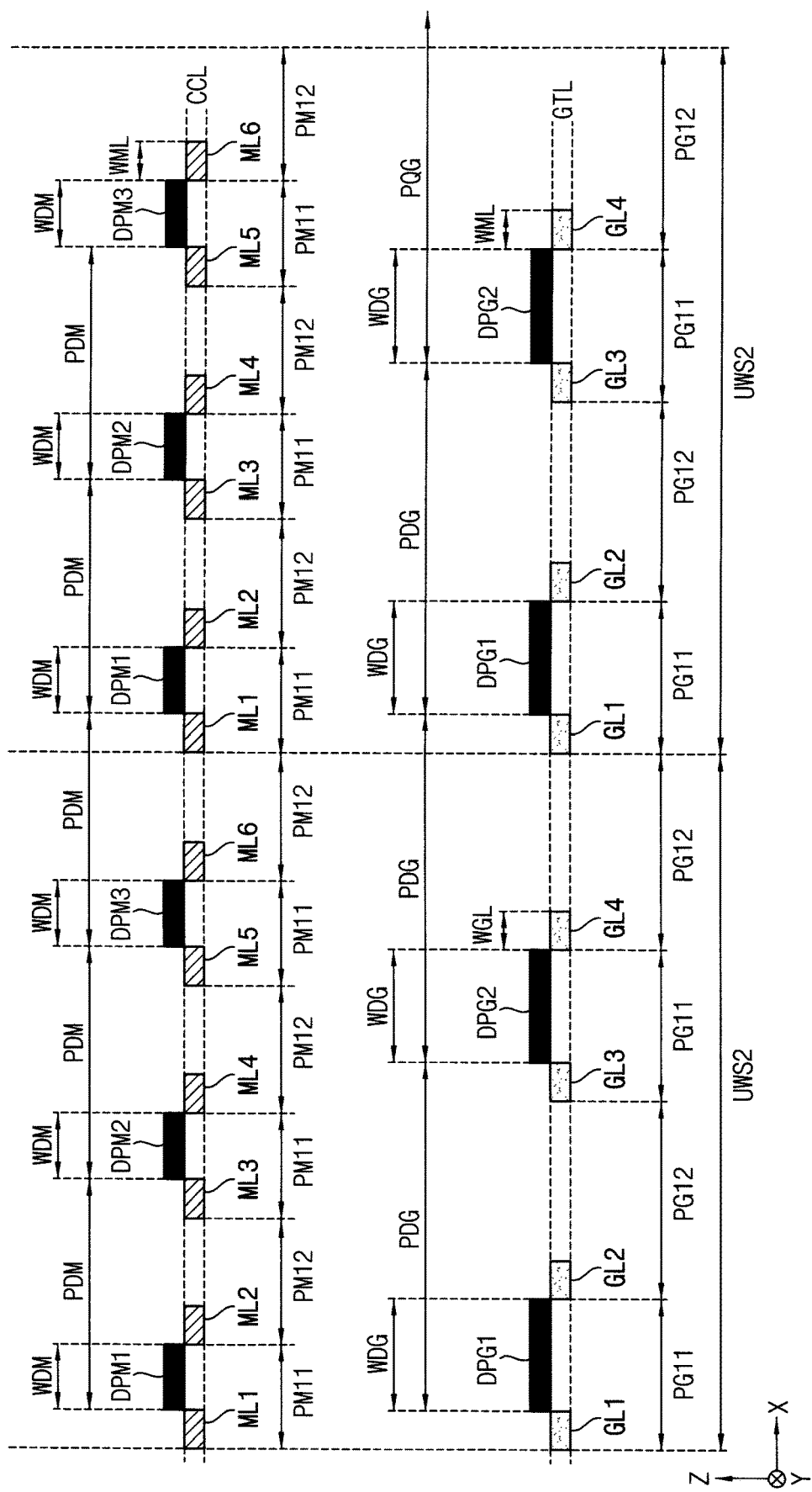
Figure 7:
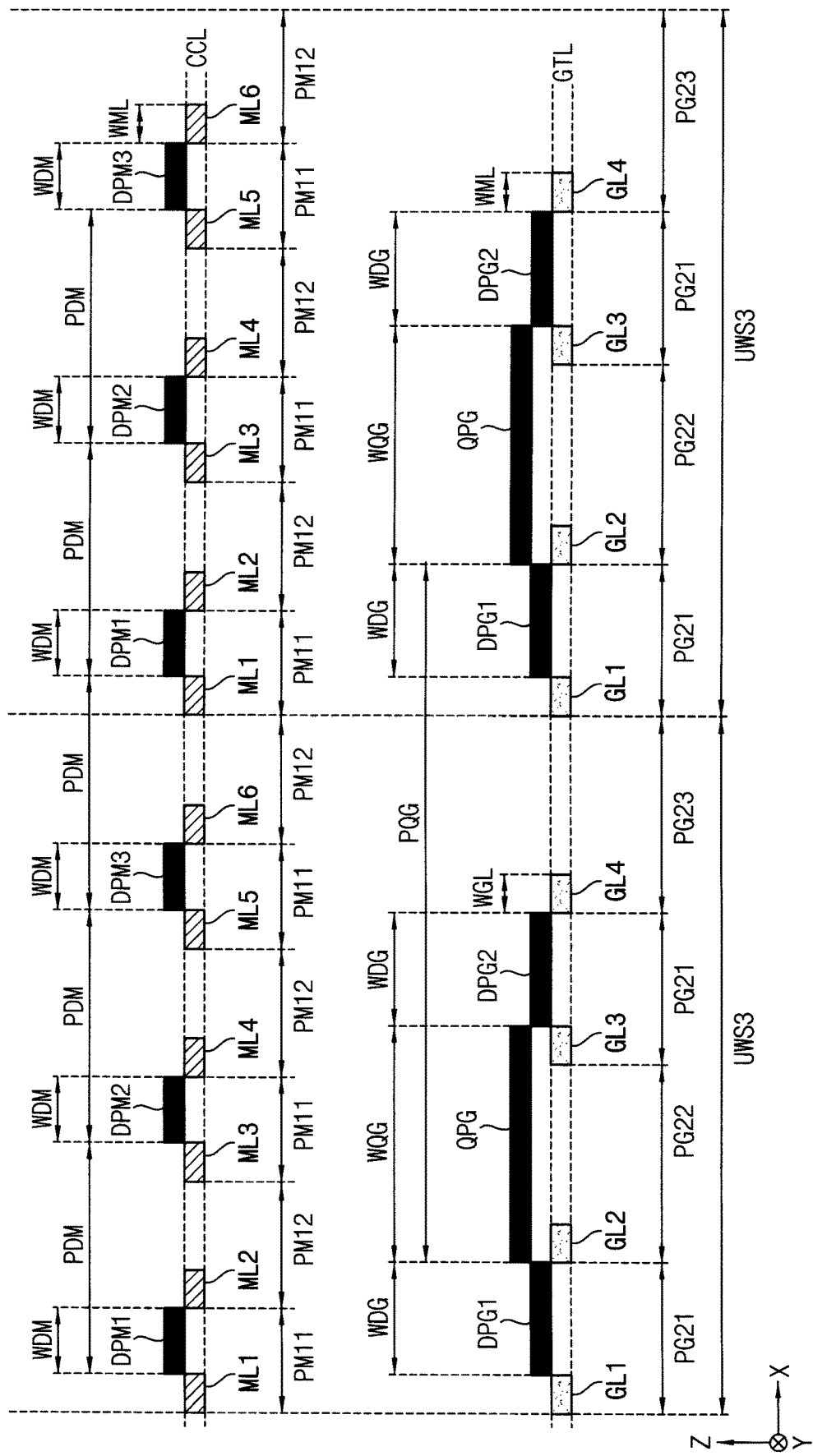

Referring to FIGS. 5, 6 and 7, each of unit wiring structures UWS1, UWS2 and UWS3 may include six column metal lines ML1~ML6 and four gate lines GL1~GL4, respectively arranged in the first direction X.

As described with reference to FIGS. 4A through 4I, double mandrel patterns DPM1, DPM2 and DPM3 may be formed above a column conduction layer CCL. The label "DPM" may be understood as follows: "D" for double, "P" for pattern, and "M" for metal. For example, the double mandrel patterns DPM1, DPM2 and DPM3 may be arranged to have the same double mandrel pitch PDM in the first direction X and the double mandrel pitch PDM may be the same as the pitch of the resist patterns.

The six column metal lines ML1~ML6 may be formed in the column conduction layer CCL using the three double mandrel patterns DPM1, DPM2 and DPM3, with respect to each of the unit wiring structures UWS1, UWS2 and UWS3.

The six column metal lines ML1~ML6 of each unit wiring structure may be arranged in the first direction X to have a first metal pitch PM11 and a second metal pitch PM12 alternately, i.e., arranged in the first direction X to alternatingly have a first metal pitch PM11 and a second metal pitch PM12. The first metal pitch PM11 and the second metal pitch PM12 may be represented by Expression 1.

$$PM11 = WDM + WML$$

$$PM12 = PDM - (WDM + WML) \quad \text{Expression 1}$$

In Expression 1, WDM indicates a width of the double mandrel patterns DPM1, DPM2 and DPM3, and WML indicates a width of the column metal lines ML1~ML6.

Before forming the column metal lines ML1~ML6, the four gate lines GL1~GL4 with respect to each unit wiring structure may be formed in a gate layer GTL below the column conduction layer CCL.

Referring to FIG. 5, the four gate lines GL1~GL4 of each unit wiring structure UWS1 may be formed by the single patterning. In this case, the four gate lines GL1~GL4 of each unit wiring structure UWS1 may be arranged in the first direction X to have an equal gate pitch PG1. The gate pitch PG1 may be equal to a pitch of resist patterns that are formed by the exposure process. FIG. 5 illustrates two unit wiring structures each with the same layout or same topography:

one on the left identified as UWS1 and one displaced to the right on the x-axis also identified as UWS1. The spatial relationships within UWS1 on the left and the same as the spatial relationships within UWS1 on the right of FIG. 5. Spatial relationships include the spacing between GL1, GL2, GL3, GL4, in the GTL and the spacing between ML1, ML2, ML3, ML4, ML5, ML6 in the CCL and also the relative spacing between features in the CCL and GTL. FIG. 5 represents a general example in which there are 6N metal lines and 4N gate lines. Within a unit wiring structure with N=1 in FIG. 5, there are six metal lines and four gate lines. FIG. 5 includes a plurality of unit wiring structures including a first unit wiring structure on the left of FIG. 5 and a second unit wiring structure on the right of FIG. 5, the second unit wiring structure is adjacent to the first unit wiring structure in the x direction (also called first direction X herein), and a topography of the second unit wiring structure is the same as a topography of the first unit wiring structure.

Referring to FIG. 6, the four gate lines GL1~GL4 of each unit wiring structure UWS2 may be formed by the SADP. As described with reference to FIGS. 4A through 4I, double mandrel patterns DPG1 and DPG2 may be formed above the gate layer GTL. The label "DPG" may be understood as follows: "D" for double, "P" for pattern, and "G" for gate. For example, the double mandrel patterns DPG1 and DPG2 may be arranged in the first direction X to have the same double mandrel pitch PDG that may be equal to the pitch of the resist patterns. In this case, the four gate lines GL1~GL4 of each unit wiring structure UWS2 may be arranged in the first direction X to have a first gate pitch PG11 and a second gate pitch PG12 alternately. The first gate pitch PG11 and the second gate pitch PG12 may be represented by Expression 2.

$$PG11=WDG+WGL$$

$$PG12=PDG-(WDG+WGL) \quad \text{Expression 2}$$

In Expression 2, WDG indicates a width of the double mandrel patterns DPG1 and DPG2, and WGL indicates a width of the gate lines GL1~GL4.

Referring to FIG. 7, the four gate lines GL1~GL4 of each unit wiring structure UWS3 may be formed by the SAQP. As described with reference to FIGS. 4A through 4I, quadruple mandrel patterns QPG and double mandrel patterns DPG1 and DPG2 may be formed sequentially above the gate layer GTL. For example, the quadruple mandrel patterns QPG may be arranged in the first direction X to have the same quadruple mandrel pitch PQG that may be equal to the pitch of the resist patterns. In this case, the four gate lines GL1~GL4 of each unit wiring structure UWS3 may be arranged in the first direction X to have a first gate pitch PG21, a second gate pitch PG22, the first pitch PG21 and a third gate pitch PG23 sequentially. The third gate pitch PG23, in some embodiments, is a distance to a next unit wiring structure. The first gate pitch PG21, the second gate pitch PG22 and the third gate pitch PG23 may be different from one another. The first gate pitch PG21, the second gate pitch PG22 and the third gate pitch PG23 may be represented by Expression 3.

$$PG21=WDG+WGL$$

$$PG22=WQG-WGL$$

$$PG23=PQG-(WQG+2WDG+WGL) \quad \text{Expression 3}$$

In Expression 3, WDG indicates a width of the double mandrel patterns DPG1 and DPG2, WQG indicates a width of the quadruple mandrel patterns QPG, and WGL indicates a width of the gate lines GL1~GL4.

Hereinafter, example embodiments of forming a plurality of column metal lines by the SAQP will be described with reference to FIGS. 8, 9 and 10.

Figure 8:
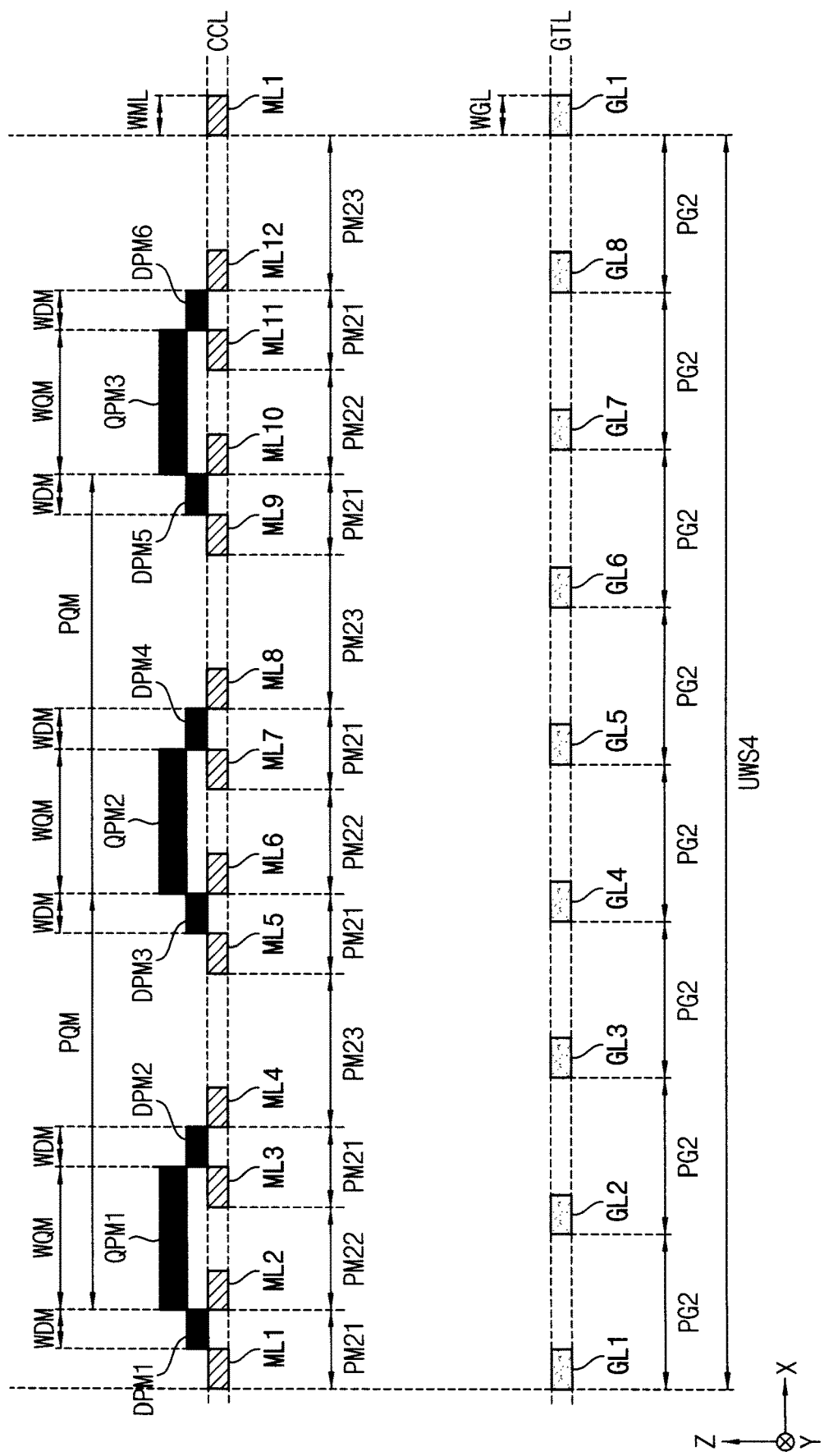
Figure 9:
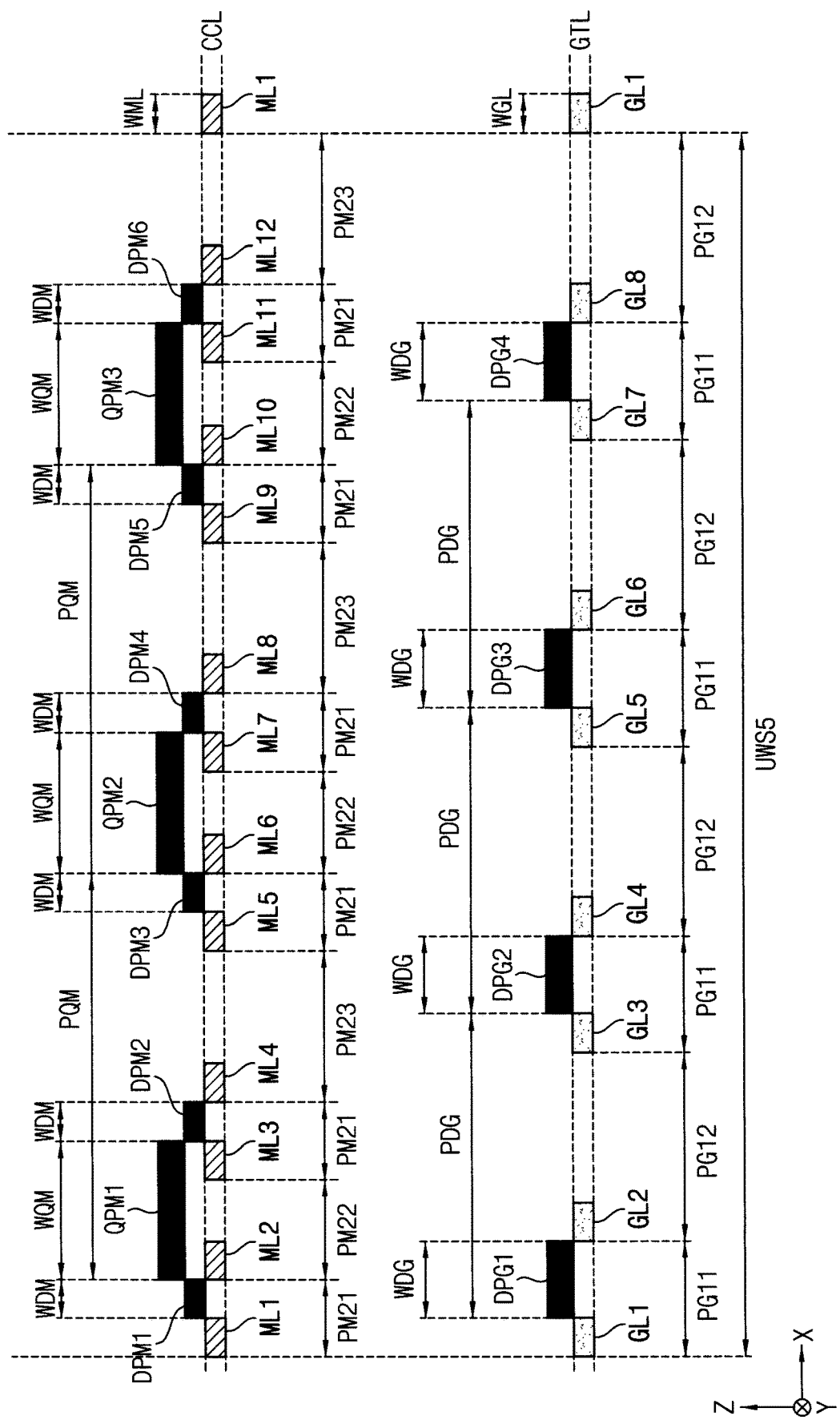
Figure 10:
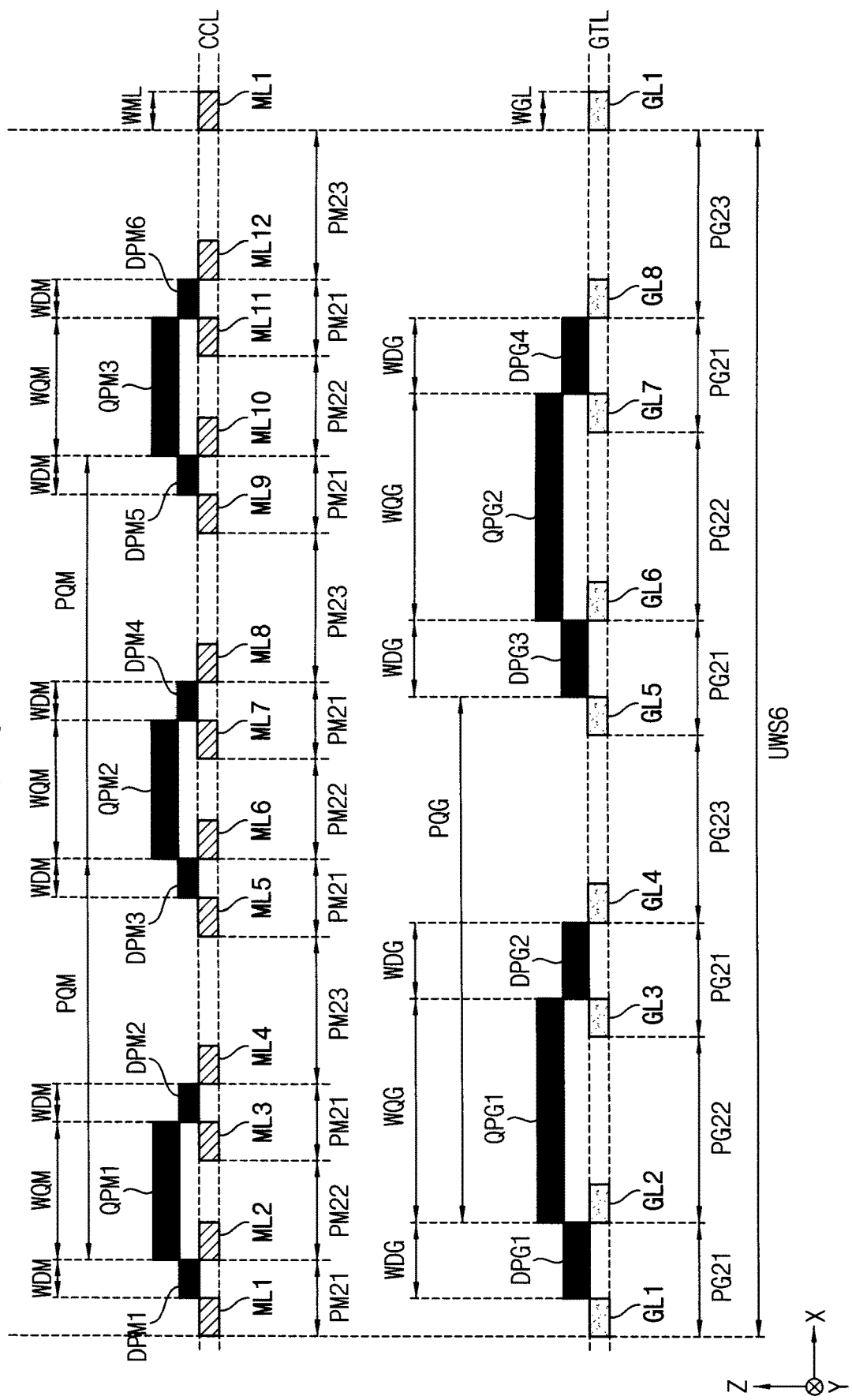

Referring to FIGS. 8, 9 and 10, each of unit wiring structures UWS4, UWS5 and UWS6 may include twelve column metal lines ML1~ML12 and eight gate lines GL1~GL8, respectively arranged in the first direction X.

As described with reference to FIGS. 4A through 4I, quadruple mandrel patterns QPM1, QPM2 and QPM3 and double mandrel patterns DPM1~DMP6 may be formed sequentially above a column conduction layer CCL. For example, the quadruple mandrel patterns QPM1, QPM2 and QMP3 may be arranged to have the same quadruple mandrel pitch PQM in the first direction X and the quadruple mandrel pitch PQM may be the same as the pitch of the resist patterns.

The twelve column metal lines ML1~ML12 may be formed in the column conduction layer CCL using the three quadruple mandrel patterns QPM1, QPM2 and QPM3, with respect to each of the unit wiring structures UWS4, UWS5 and UWS6.

The twelve column metal lines ML1~ML12 of each unit wiring structure may be arranged in the first direction X to have a first metal pitch PM21, a second metal pitch PM22, the first metal pitch PM21 and a third metal pitch PM23 sequentially and repeatedly. The first metal pitch PM21, the second metal pitch PM22 and the third metal pitch PM23 may be represented by Expression 5.

$$PM21=WDM+WML$$

$$PM22=WQM-WML$$

$$PM23=PQM-(WQM+2WDM+WML) \quad \text{Expression 4}$$

In Expression 4, WDM indicates a width of the double mandrel patterns DPM1~DPM6, WQM indicates a width of the quadruple mandrel patterns QPM1, QPM2 and QPM3, and WML indicates a width of the column metal lines ML1~ML12.

Before forming the column metal lines ML1~ML12, the eight gate lines GL1~GL8 with respect to each unit wiring structure may be formed in a gate layer GTL below the column conduction layer CCL.

Referring to FIG. 8, the eight gate lines GL1~GL8 of each unit wiring structure UWS4 may be formed by the single patterning. In this case, the eight gate lines GL1~GL8 of each unit wiring structure UWS4 may be arranged in the first direction X to have an equal gate pitch PG2. The gate pitch PG2 may be equal to a pitch of resist patterns that are formed by the exposure process.

Referring to FIG. 9, the eight gate lines GL1~GL8 of each unit wiring structure UWS5 may be formed by the SADP. As described with reference to FIGS. 4A through 4I, double mandrel patterns DPG1~DPG4 may be formed above the gate layer GTL. For example, the double mandrel patterns DPG1~DPG4 may be arranged in the first direction X to have the same double mandrel pitch PDG that may be equal to the pitch of the resist patterns. In this case, the eight gate lines GL1~GL8 of each unit wiring structure UWS5 may be arranged in the first direction X to have a first gate pitch PG11 and a second gate pitch PG12 alternately. The first gate pitch PG11 and the second gate pitch PG12 may be different from each other. The first gate pitch PG11 and the second gate pitch PG12 may be represented by Expression 2.

Referring to FIG. 10, the eight gate lines GL1~GL8 of each unit wiring structure UWS6 may be formed by the SAQP. As described with reference to FIGS. 4A through 4I, quadruple mandrel patterns QPG1 and QPG2 and double mandrel patterns DPG1~DPG4 may be formed sequentially above the gate layer GTL. For example, the quadruple mandrel patterns QPG1 and QPG2 may be arranged in the first direction X to have the same quadruple mandrel pitch PQG that may be equal to the pitch of the resist patterns. In this case, the eight gate lines GL1~GL8 of each unit wiring structure UWS6 may be arranged in the first direction X to have a first gate pitch PG21, a second gate pitch PG22, the first pitch PG21 and a third gate pitch PG23 sequentially. The first gate pitch PG21, the second gate pitch PG22 and the third gate pitch PG23 may be different from one another. The first gate pitch PG21, the second gate pitch PG22 and the third gate pitch PG23 may be represented by Expression 3.

The integrated circuit and the method of manufacturing and designing the integrated circuit according to example embodiments may enhance design efficiency and performance of the integrated circuit through the unit wiring structures UWS1~UWS6.

Hereinafter, an example structure of a standard cell is described with reference to FIGS. 11, 12A, 12B and 12C, which may support understanding of a layout of an integrated circuit according to example embodiments.

Figure 11:
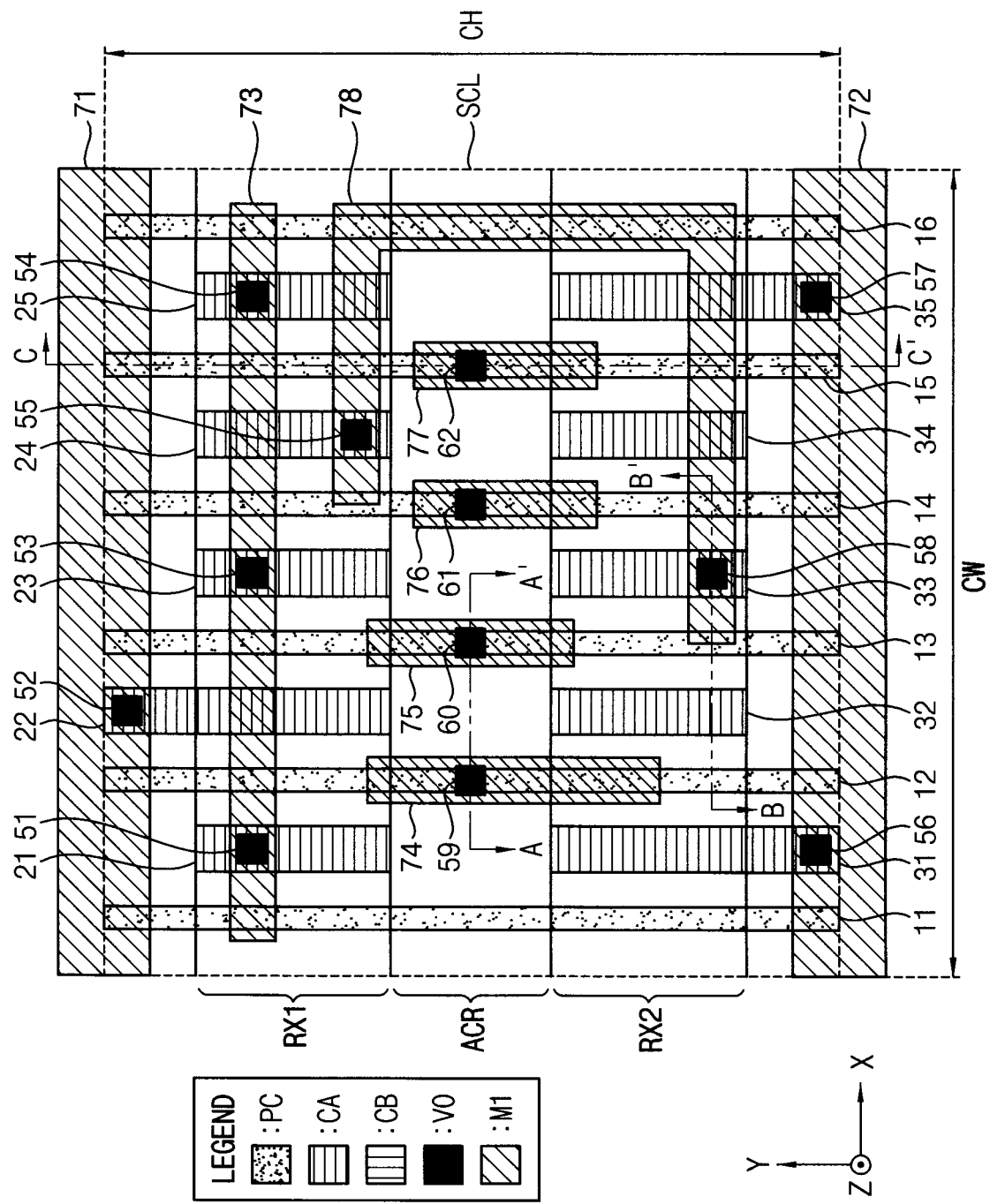
FIG. 11 is a diagram illustrating a layout of an example standard cell.

FIG. 11 is schematic in nature, and not all features of the above embodiments are illustrated in FIG. 11. FIG. 2 illustrates that, in some embodiments, metal lines "ML" occur in a ratio of 6 to 4 with respect to gate lines, "GL." FIGS. 5 and 7 illustrate embodiments in which six metal lines and four gate lines occur in a single unit wiring structure (UWS). FIG. 7 illustrates an embodiment in which twelve metal lines ("ML") occur in a single unit wiring structure (UWS) with eight gate lines ("GL").

Figure 12A:
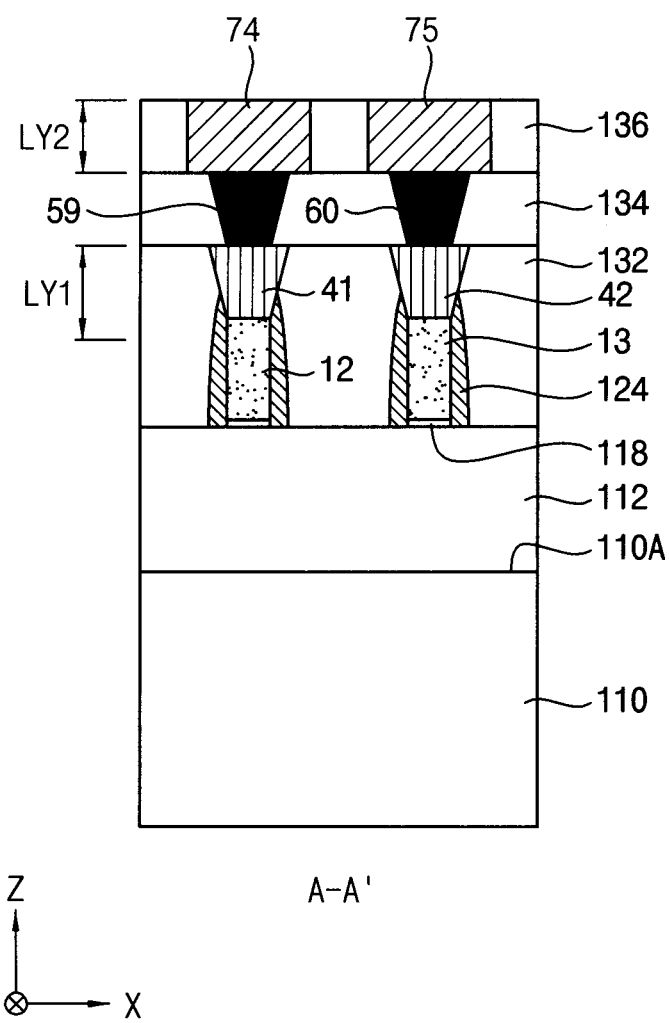
Figure 12C:
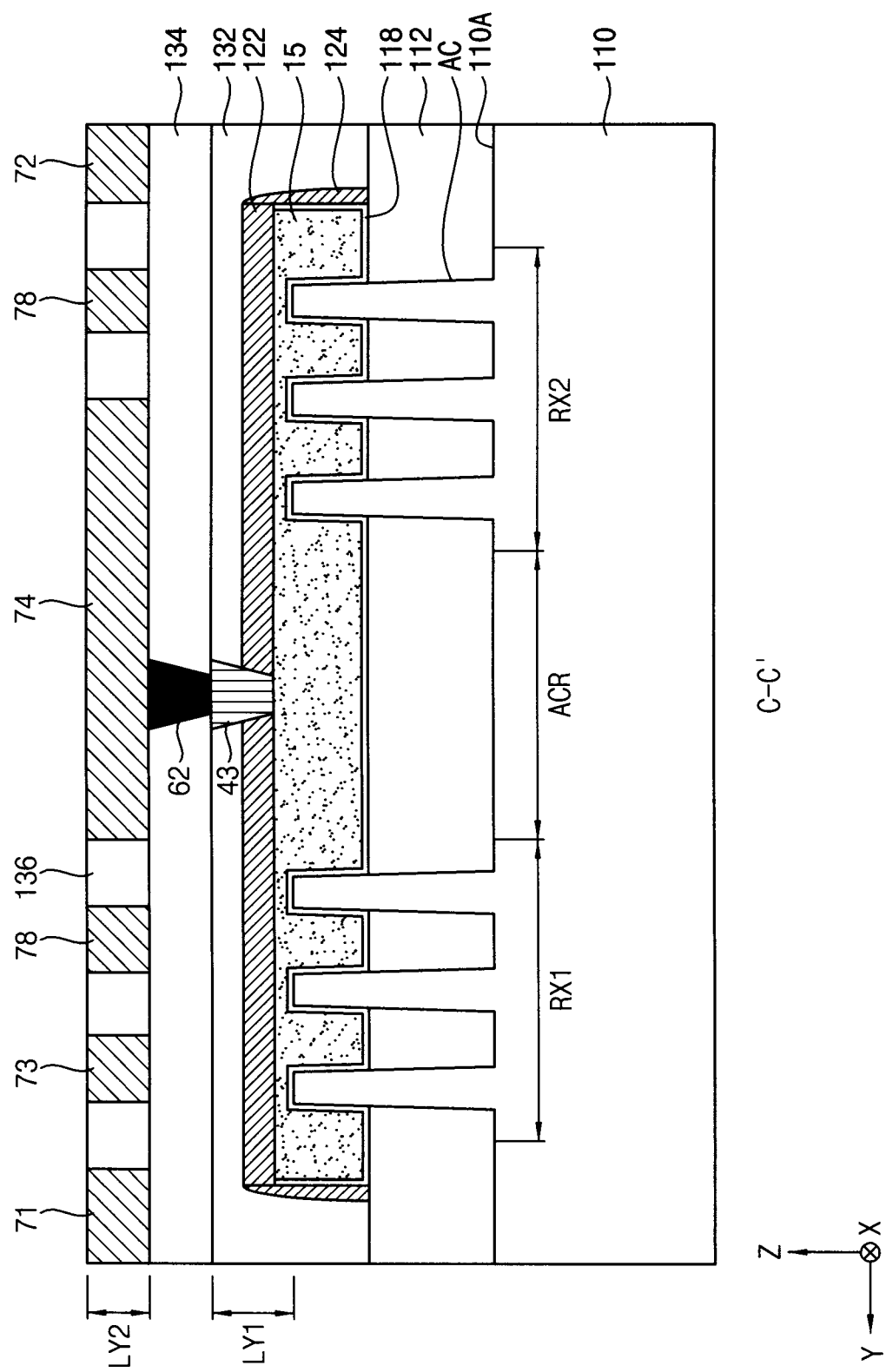

FIG. 11 is a diagram illustrating a layout of an example standard cell, and FIGS. 12A, 12B and 12C are cross-sectional views of the standard cell of FIG. 11.

FIGS. 12A, 12B, and 12C illustrate a portion of a standard cell SCL that includes a fin field effect transistor (FinFET). FIG. 12A is a cross-sectional view of the standard cell SCL of FIG. 11 along a line A-A". FIG. 12B is a cross-sectional view of the standard cell SCL of FIG. 11 along a line B-B'. FIG. 12C is a cross-sectional view of the standard cell SCL of FIG. 11 along a line C-C'.

Referring to FIGS. 11, 12A, 12B, and 12C, the standard cell may be formed on a substrate 110 having an upper surface 110A that extends in a horizontal direction, e.g., the first direction X and the second direction Y.

In some example embodiments, the substrate 110 may include a semiconductor, e.g., silicon (Si), germanium (Ge), and the like, or a compound semiconductor, e.g., SiGe, SiC, GaAs, InAs, InP, and the like. In some example embodiments, the substrate 110 may have a silicon on insulator (SOI) structure. The substrate 110 may include a conductive area, e.g., an impurity-doped well or an impurity-doped structure.

The standard cell may include a first device area RX1, a second device area RX2, and an active cut area ACR separating the first and second device areas RX1 and RX2 along the second direction Y. Each of the first and second device areas RX1 and RX2 may include a plurality of fin-type active areas AC protruding along the third direction Z from the substrate 110 (See FIG. 11C).

The plurality of active areas AC may extend in parallel to one another in the first direction X. A device isolation layer 112 may be between the plurality of active areas AC on the substrate 110 along the second direction Y. The plurality of active areas AC protrude from the device isolation layer 112 along the third direction Z in the form of fins.

A plurality of gate insulation layers 118 and a plurality of gate lines PC 11, 12, 13, 14, 15, and 16 may be formed on the substrate 110. The gate lines PC 11, 12, 13, 14, 15 and 16 may extend in the second direction Y crossing the plurality of active areas AC. The plurality of gate insulation layers 118 and the plurality of gate lines PC 11, 12, 13, 14, 15, and 16 may cover an upper surface and sidewalls of each of the active areas AC and an upper surface of the device isolation layer 112. A plurality of metal oxide semiconductor (MOS) transistors may be formed along the plurality of gate lines PC 11, 12, 13, 14, 15 and 16. The MOS transistors may have a three-dimensional structure in which channels are formed in the upper surface and the two sidewalls of the active areas AC. FIG. 11 is provided with a legend: "PC" represents a gate line, "CA" represents a contact, "CB" represents a contact, "VO" represents a via contact, and "M1" represents a wiring.

The gate insulation layers 118 may be formed of a silicon oxide layer, a high-k dielectric layer, or a combination thereof. The plurality of gate lines PC 11, 12, 13, 14, 15, and 16 may extend on the gate insulation layers 118 across the plurality of active areas AC while covering the upper surface and the two sidewalls of each of the active areas AC.

A mask 122 may be formed on each of the gate lines PC 11, 12, 13, 14, 15, and 16. Side walls of the insulation layer 118, the gate line PC, and the mask 122 may be covered by a spacer 124. In particular, the spacer 124 may extend along the insulation layer 118, the gate line PC, and the mask 122 along the third direction Z. In the cross-section shown in FIG. 11C, the insulation layer 118 may extend along the third direction Z between the gate line PC and the spacer 124.

The gate lines PC 11, 12, 13, 14, 15, and 16 may have a structure in which a metal nitride layer, a metal layer, a conductive capping layer, and a gap-fill metal layer are sequentially stacked. The metal nitride layer and the metal layer may include titanium (Ti), tantalum (Ta), tungsten (W), ruthenium (Ru), niobium (Nb), molybdenum (Mo), hafnium (Hf), and the like. The metal layer and the metal nitride layer may be formed, e.g., by using an atomic layer deposition (ALD) method, a metal organic ALD method, and/or a metal organic chemical vapor deposition (MOCVD) method. The conductive capping layer may function as a protection layer that prevents oxidization of a surface of the metal layer. In addition, the conductive capping layer may function as an adhesive layer (e.g., a wetting layer) that facilitates deposition of another conductive layer on the metal layer. The conductive capping layer may be formed of a metal nitride, e.g., a TiN, TaN, a combination thereof, and the like. The gap-fill metal layer may fill spaces between the active areas AC and extend on the conductive capping layer. The gap-fill metal layer may be formed of a W (e.g., tungsten) layer. The gap-fill metal layer may be formed, e.g., by using an ALD method, a CVD method, or a physical vapor deposition (PVD) method.

A plurality of conductive contacts CA and CB may be on a first layer LY1 on the active areas AC. The plurality of conductive contacts CA and CB include a plurality of first contacts CA 21, 22, 23, 24, 25, 31, 32, 33, 34, and 35 connected to a source/drain area 116 of the active areas AC (See FIG. 11B) and a plurality of second contacts CB 41, 42, and 43 connected to the gate lines 11, 12, 13, 14, 15, and 16 (See FIGS. 11A and 11C).

The plurality of conductive contacts CA and CB may be insulated from each other by a first interlayer insulation layer 132 that covers the active areas AC and the gate lines GL. The plurality of conductive contacts CA and CB may have an upper surface that is at substantially the same level as an upper surface of the first interlayer insulation layer 132. The first interlayer insulation layer 132 may be a silicon oxide layer.

A second interlayer insulation layer 134 and a plurality of lower via contacts V0 51, 52, 53, 54, 55, 56, 57, 58, 59, 60, 61, and 62 that pass through the second interlayer insulation layer 134 are on the first interlayer insulation layer 132. The second interlayer insulation layer 134 may be a silicon oxide layer.

A plurality of wirings M1 71, 72, 73, 74, 75, 76, 77, and 78 extending in the first direction X on a second layer LY2, which is higher than the first layer LY1, e.g., further from the substrate 110 along the third direction Z, may be on the second interlayer insulation layer 134. Each of the wirings M1 may be connected to one of the plurality of conductive contacts CA and CB through one of the plurality of lower via contacts V0 formed between the first layer LY1 and the second layer LY2. Each of the plurality of lower via contacts V0 may be connected to one of the plurality of conductive contacts CA and CB, e.g., by passing through the second interlayer insulation layer 134. The plurality of lower via contacts V0 may be insulated from one another by the second interlayer insulation layer 134.

The wirings 71~78 may include an internal connection wiring that electrically connects a plurality of areas in the standard cell SCL. For example, the internal connection wiring 78 may electrically connect the active area AC in the first device area RX1 and the active area AC in the second device area RX2 through the lower via contacts 55 and 58 and the first contacts 24 and 33.

Wirings 71 and 72 may correspond to the first power rail and the second power rail, respectively. The first power rail 71 may be connected to the active area AC in the first device area RX1. The second power rail 72 may be connected to the active area AC in the second device area RX2. One of the first and second power rails 71 and 72 may be a wiring for supplying a power supply voltage (e.g., the first power supply voltage VDD) and the other of the first and second power rails 71 and 72 may be a wiring for supplying a ground voltage (e.g., the second power supply voltage VSS).

The first power rail 71 and the second power rail 72 may extend in the first direction X parallel to one another on the second layer LY2. In some example embodiments, the power rails 71 and 72 may be formed at substantially the same time with the other wirings 73~78. The wirings M1 may be pass through a third interlayer insulation layer 136. The third interlayer insulation layer 136 may insulate the wirings M1 from one another.

A cell height CH of the standard cell SCL may be defined by the distance along the second direction Y between the first power rail 71 and the second power rail 72. A cell width CW of the standard cell SCL may be defined along the first direction X that is parallel to the power rails 71 and 72.

The pitch of the wirings M1 may have to meet limitations due to a minimum spacing rule. For example, the wirings M1 may have to meet limitations according to a "tip-to-side" restriction and a "corner rounding" restriction. The size, disposition, and spacing of the wirings M1 may be limited by such restrictions.

The lower via contacts V0 and the wirings M1 may have a stacked structure of a barrier layer and a wiring conductive layer. The barrier layer may be formed of, e.g., TiN, TaN, a combination thereof, and so forth. The wiring conductive layer may be formed, e.g., of W, Cu, an alloy thereof, a combination thereof, and so forth. A CVD method, an ALD method, and/or an electroplating method may be used to form the wirings M1 and the lower via contacts V0.

The integrated circuit according to some example embodiments may correspond to a combination of various standard cells. Even though not illustrated in figures. The column metal lines to form the unit wiring structure according to example embodiments may be formed in M2 layer or M3 layer above the second layer LY2.

Figure 13:
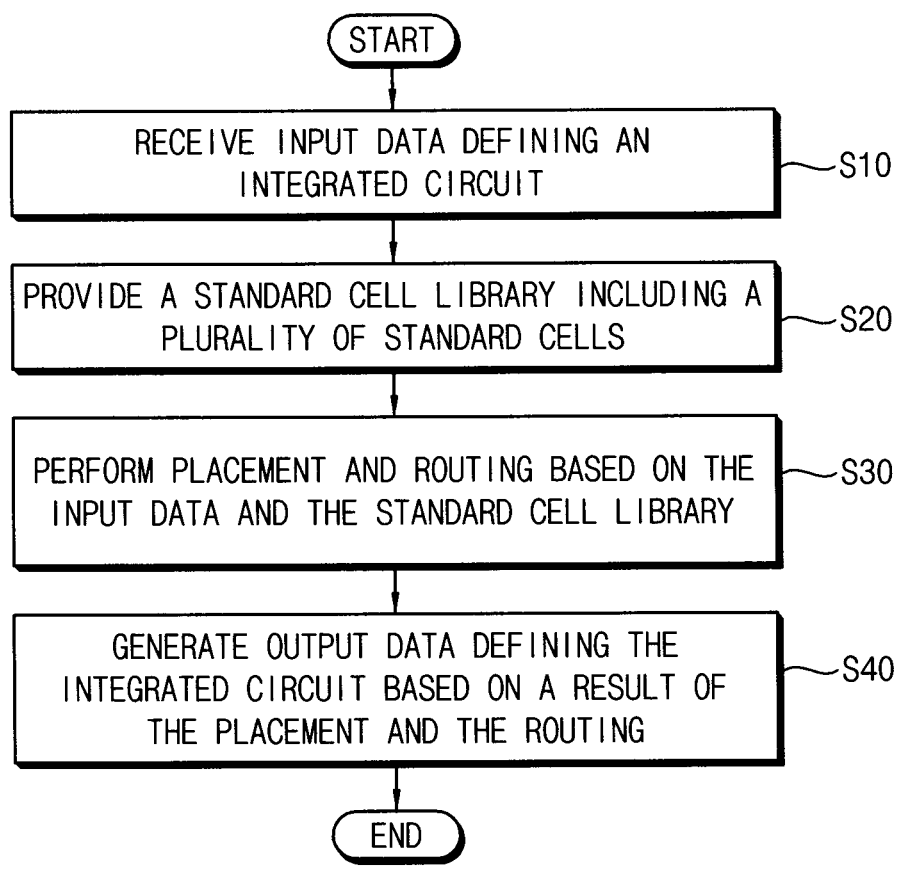
FIG. 13 is a diagram illustrating a method of designing an integrated circuit according to example embodiments.

FIG. 13 is a diagram illustrating a method of designing an integrated circuit according to example embodiments.

The method of FIG. 13 may include a method of designing a layout of the integrated circuit that is performed by a designing tool. In some example embodiments, the designing tool may include a programming software including a plurality of instructions executable by a processor, i.e., software implemented in some form of hardware (e.g. processor, ASIC, etc.).

Referring to FIG. 13, input data defining the integrated circuit may be received (S10). For example, an integrated circuit may be defined by a plurality of cells and the integrated circuit may be designed using a cell library including information of the plurality of cells. Hereinafter, a cell may be a standard cell and a cell library may be a standard cell library.

In some example embodiments, the input data may be data generated from an abstract form with respect to behavior of the integrated circuit. For example, the input data may be defined in a register transfer level (RTL) through synthesis using the standard cell library. For example, the input data may be a bitstream and/or a netlist that is generated by synthesizing the integrated circuit defined by a hardware description language (HDL) such as VHSIC hardware description language (VHDL) or Verilog.

In some example embodiments, the input data may be data for defining the layout of the integrated circuit. For example, the input data may include geometric information for defining a structure implemented as a semiconductor material, a metal, and an insulator. A layout of the integrated circuit indicated by the input data may have a layout of the cells and conducting wires used to connect a cell to other cells, for example.

A standard cell library including a plurality of standard cells is provided (S20). The term "standard cell" may refer to a unit of an integrated circuit in which a size of the layout meets a preset or specified rule. The standard cell may include an input pin and an output pin and may process a signal received through the input pin to output a signal through the output pin. For example, the standard cell may be a basic cell such as an AND logic gate, an OR logic gate, a NOR logic gate, or an inverter, a complex cell such as an OR/AND/INVERTER (OAI) or an AND/OR/INVERTER (AOI), and a storage element such as a master-slave flip flop or a latch.

The standard cell library may include information about a plurality of standard cells. For example, the standard cell library may include a name and a function of a standard cell, as well as timing information, power information, and layout information of the standard cell. The standard cell library may be stored in a storage device and the standard cell library may be provided by accessing the storage device.

Placement and routing are performed based on the input data and the standard cell library (S30) and output data defining the integrated circuit are provided based on a result of the placement and the routing (S40).

In some example embodiments, when the received input data are data such as the bitstream or the netlist generated by synthesizing the integrated circuit, the output data may be the bitstream or the netlist. In other example embodiments, when the received input data are data defining the layout of the integrated circuit, for example, the data having a graphic data system II (GDSII) format, a format of the output data may also be data defining the layout of the integrated circuit.

The integrated circuit designed and manufactured by the method of FIG. 13 may include a semiconductor substrate, a plurality of gate lines and a plurality of column metal lines. As described with reference to FIGS. 1 through 10, 6N metal lines and 4N gate lines form a unit wiring structure where N is a positive integer and a plurality of unit wiring structures are arranged in the first direction.

Figure 14:
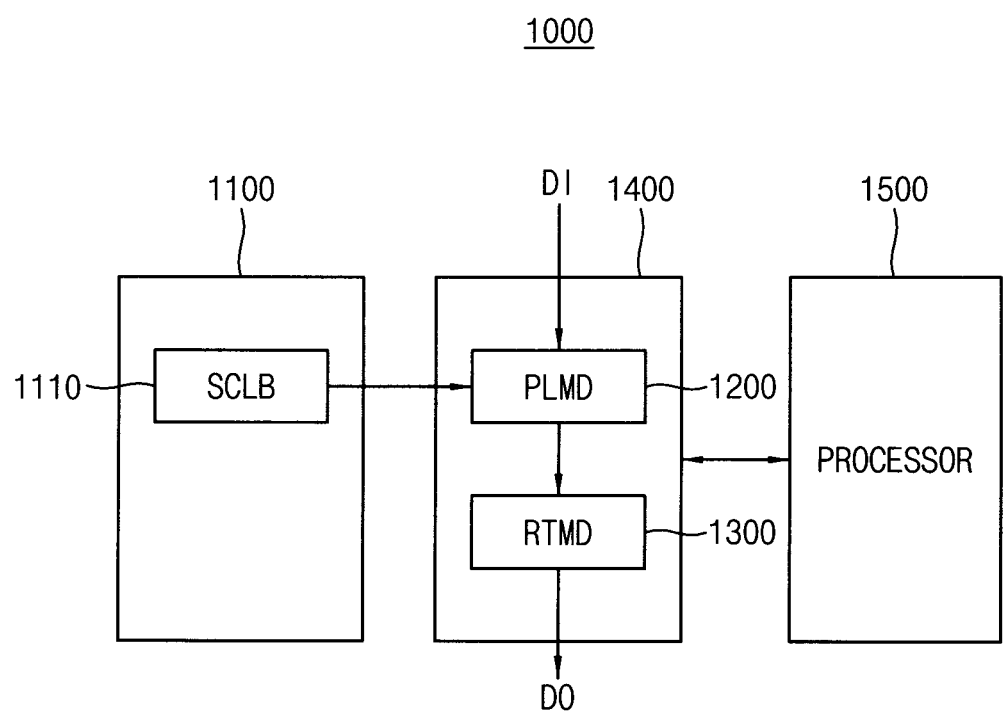
FIG. 14 is a block diagram illustrating a designing system of an integrated circuit according to example embodiments.

FIG. 14 is a block diagram illustrating a designing system of an integrated circuit according to example embodiments.

Referring to FIG. 14, a designing system 1000 may include a storage medium 1100, a designing module 1400 and a processor 1500.

The storage medium 1100 (e.g., a storage device) may store a standard cell library SCLB 1110. The standard cell library 1110 may be provided from the storage medium 1100 to the designing module 1400. The standard cell library 1110 may include a plurality of standard cells, and the standard cell may be a small, e.g., minimum, unit for designing a block, a device and/or a chip.

The storage medium 1100 may include any computer-readable storage medium used to provide commands and/or data to a computer as a computer-readable storage medium. For example, the computer-readable storage medium 1100 may include volatile memory such as random access memory (RAM), read only memory (ROM), etc. and non-volatile memory such as flash memory, magnetoresistive RAM (MRAM), phase-change RAM (PRAM), resistive RAM (RRAM), etc. The computer-readable storage medium 1100 may be inserted into the computer, may be integrated in the computer, or may be coupled to the computer through a communication medium such as a network and/or a wireless link.

The designing module 1400 may include a placement module PLMD 1200 and a routing module RTMD 1300.

Herein, the term "module" may indicate, but is not limited to, a software and/or hardware component, such as a field programmable gate array (FPGA) or an application specific integrated circuit (ASIC), which performs certain tasks. A module may reside in a tangible, addressable storage medium and may execute on one or more processors. For example, a module may include software components, class components, task components, processes, functions, attributes, procedures, subroutines, program code segments, drivers, firmware, micro codes, circuits, data, database, data structures, tables, arrays, parameters, etc. A module may be divided into a plurality of modules performing detailed functions.

The placement module 1200 may, using the processor 1500, arrange standard cells based on input data DI defining the integrated circuit and the standard cell library 1110. The routing module 1300 may perform signal routing with respect to cell placement provided from the placement module 1200. If the routing is not successful, the placement module 1200 may modify the previous cell placement and the routing module 1300 may perform the signal routing with the modified cell placement. When the routing is successfully completed, the routing module 1300 may provide output data DO defining the integrated circuit.

The placement module 1200 and the routing module 1300 may be implemented by a single integrated designing module 1400 or may be implemented by separate and different modules. The integrated designing module 1400 including the placement module 1200 and the routing module 1300 may perform the placement and the routing such that the delay matching and/or the duty ratio adjustment may be implemented in the integrated circuit using the plurality of load standard cells.

The placement module 1200 and/or the routing module 1300 may be implemented in software, but example embodiments are not limited thereto. If the placement module 1200 and the routing module 1300 are implemented in software, they may be stored in the storage medium 1100 as program codes or in other storage mediums.

The processor 1500 may be used when the designing module 1400 performs a computation. In FIG. 14, only one processor 1500 is illustrated. Alternatively, a plurality of processors may be included in the designing system 1000. In addition, the processor 1500 may include cache memories, which increase computation capacity.

As such, the integrated circuit and the method of designing the integrated circuit according to example embodiments may enhance design efficiency and performance of the integrated circuit through the unit wiring structure.

Figure 15:
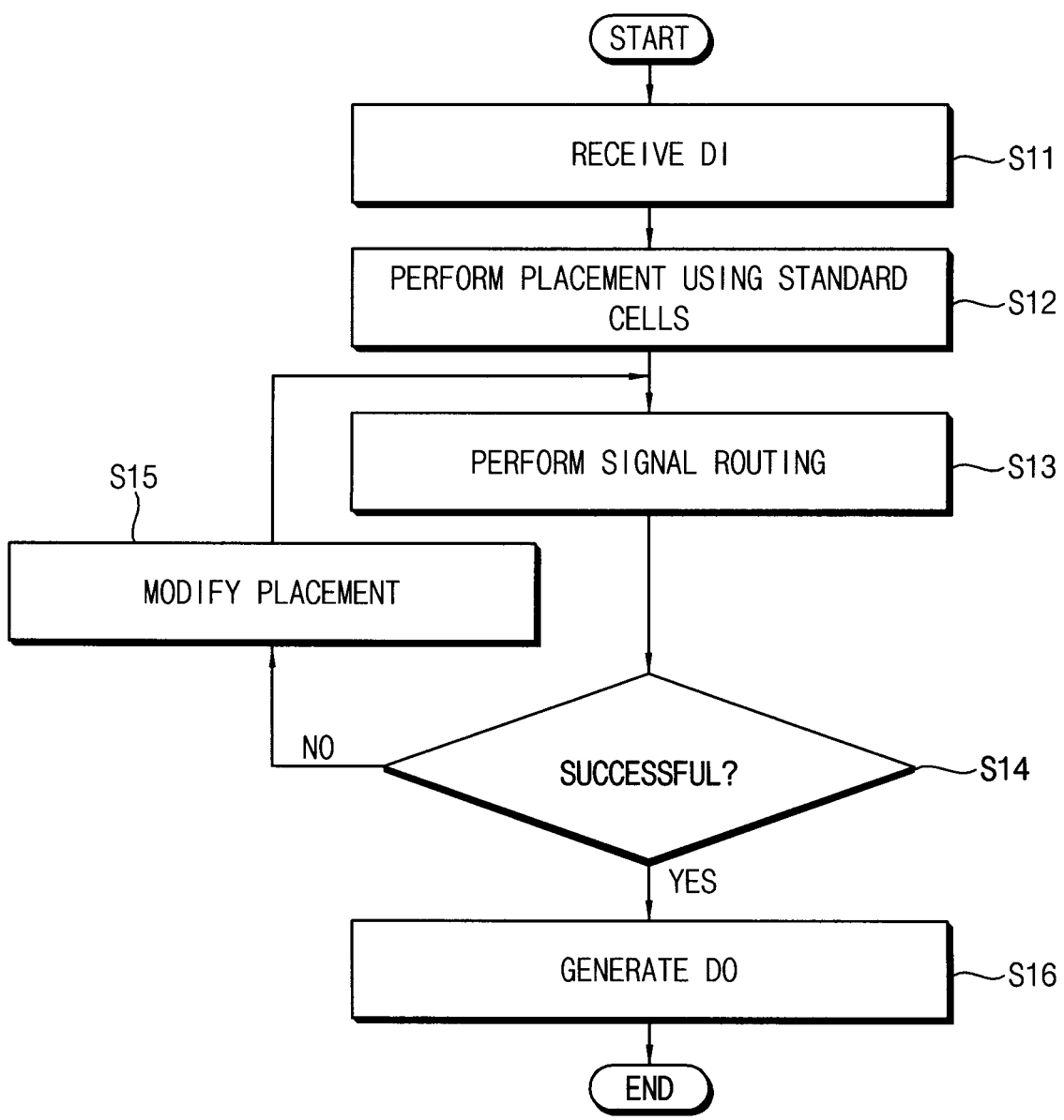
FIG. 15 is a flow chart illustrating an example operation of the designing system of FIG. 14.

FIG. 15 is a flow chart illustrating an example operation of the designing system of FIG. 14.

Referring to FIGS. 14 and 15, the designing module 1400 may receive the input data DI defining the integrated circuit (S11). The placement module 1200 may refer to the standard cell library 1110 including a plurality of standard cells as described above so as to extract standard cells corresponding to the input data DI, and may perform cell placement using the extracted standard cells (S12). The routing module 1300 may perform signal routing with respect to the placed cells (S13).

When the signal routing is not successful (S14: NO), the placement module 1200 may replace at least one standard cell, e.g. may replace at least one standard cell with another standard cell, to modify the placement of the cells (S15). The routing module 1300 may perform the signal routing again with respect to the modified placement (S13).

As such, the replacement and the routing may be repeated until the signal routing is successfully completed. When the signal routing is successfully completed (S14: YES), the designing module 1400 may generate the output data DO defining the integrated circuit (S16).

Figure 16:
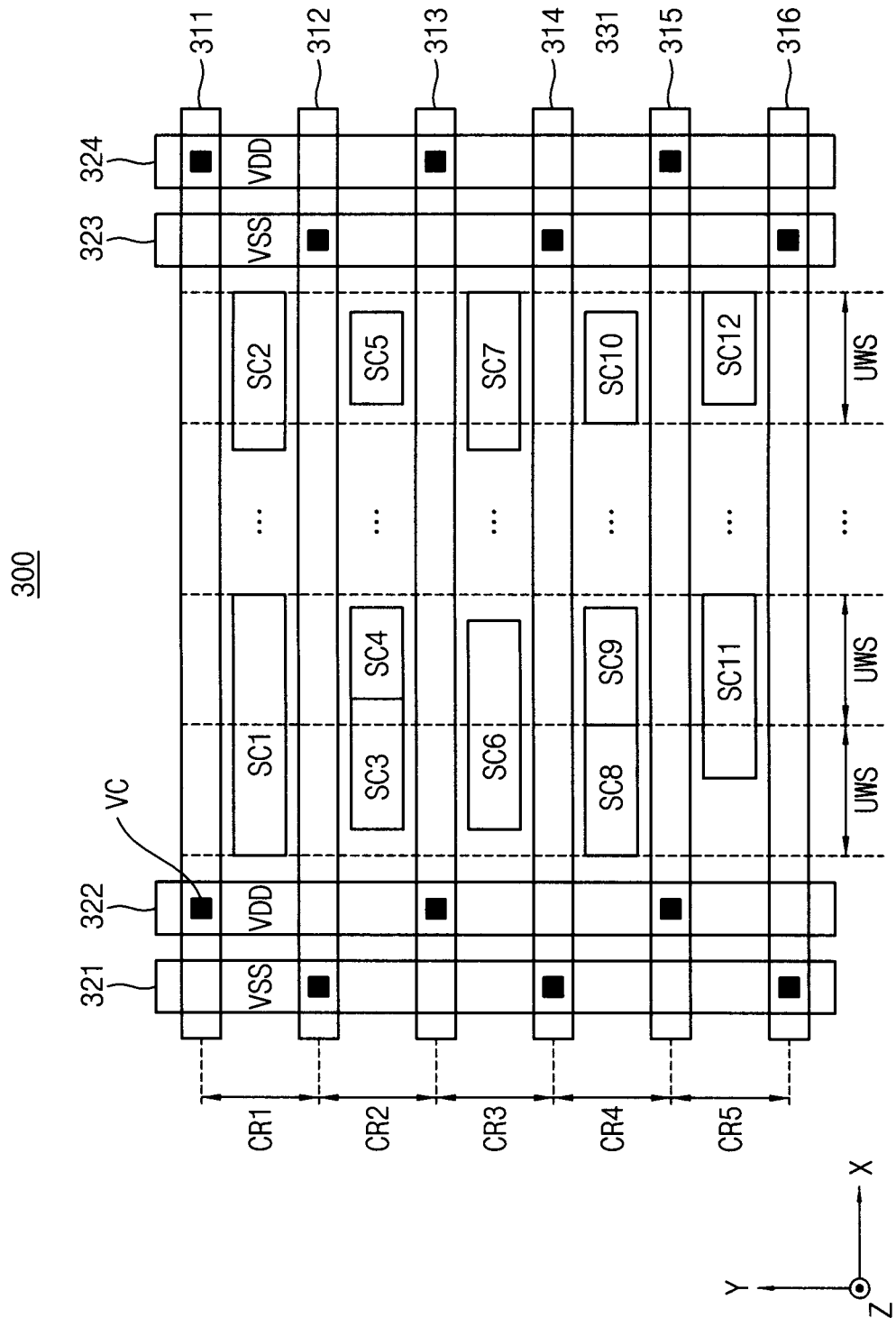
FIG. 16 is a diagram illustrating a layout of an integrated circuit according to example embodiments.

FIG. 16 is a diagram illustrating a layout of an integrated circuit according to example embodiments.

An integrated circuit 300 of FIG. 16 may be an application specific integrated circuit (ASIC). A layout of the integrated circuit 300 may be determined by performing the above-described placement and routing of standard cells SC1~SC12. Power may be provided to the standard cells SC1~SC12 through power rails 311~316. The power rails 311~316 may include high power rails 311, 313, and 315 to provide a first power supply voltage VDD, and low power rails 312, 314, and 316 to provide a second power supply voltage VSS lower than the first power supply voltage VDD. For example, the first power supply voltage VDD may have a positive voltage level and the second power supply voltage VSS may have a ground level (e.g., 0V) or a negative voltage level.

The high power rails 311, 313, and 315, and the low power rails 312, 314, and 316 extend in the first direction X and are arranged alternatively one by one in the second direction Y to form boundaries of a plurality of circuit rows CR1~CR5 corresponding to the regions defined by the power rails 311~316 arranged in the second direction Y.

According to some example embodiments, power may be distributed to the power rails 311~316 through power mesh routes 321~324 that extend in the second direction Y. Some power mesh routes 322 and 324 may provide the first power supply voltage VDD and other power mesh routes 321 and 323 may provide the second power supply voltage VSS. The power mesh routes 321~324 may be connected to the power rails 311~316 through vertical contacts VC such as via contacts.

In general, each of the circuit rows CR1~CR5 may be connected to two adjacent power rails that are at boundaries thereof so as to be powered. For example, the standard cells SC1, SC2, SC3, and SC4 in the first circuit row CR1 may be connected to an adjacent and corresponding power rail pair including the high power rail 311 and the low power rail 312.

According to example embodiments, as illustrated in FIG. 16, the integrated circuit 300 may include a plurality of unit wiring structures UWS arranged repeatedly in the first direction X. Each unit wiring structure UWS includes 6N column metal lines and 4N gate lines as described above.

Figure 17:
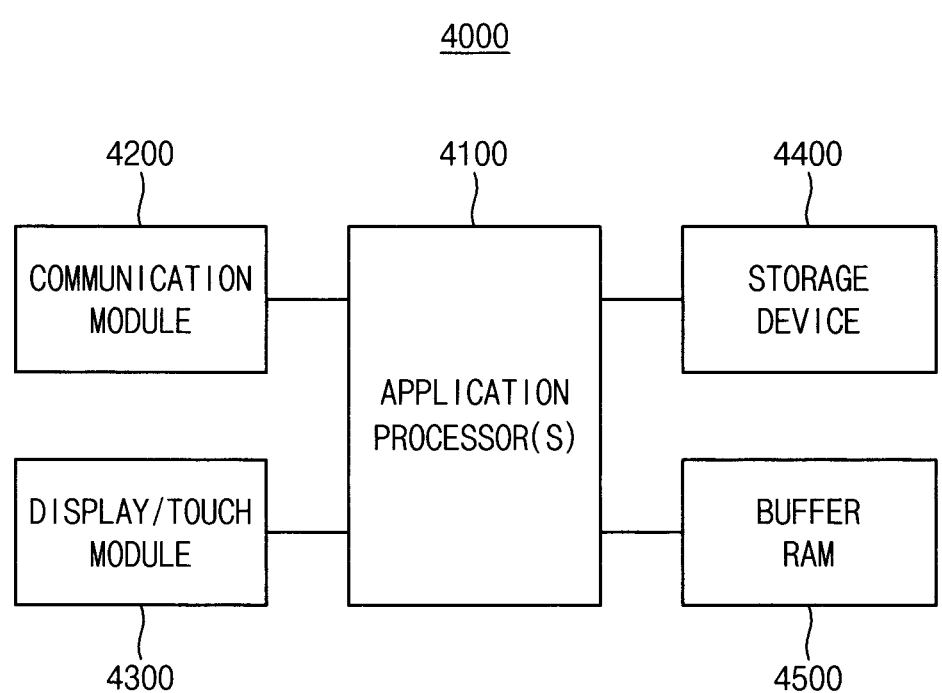
FIG. 17 is a block diagram illustrating a mobile device according to example embodiments.

FIG. 17 is a block diagram illustrating a mobile device according to example embodiments.

Referring to FIG. 17, a mobile device 4000 may include at least one application processor 4100, a communication module 4200, a display/touch module 4300, a storage device 4400, and a buffer RAM 4500.

The application processor 4100 may control operations of the mobile device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the mobile device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the mobile device 4000 may include an integrated circuit having a unit wiring structure according to example embodiments as described above.

As such, the integrated circuit and the method of manufacturing and designing the integrated circuit according to example embodiments may enhance design efficiency and performance of the integrated circuit through the unit wiring structure.

Embodiments may be applied to any electronic devices and systems. For example, embodiments may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. An integrated circuit comprising:
    a semiconductor substrate;
    a plurality of gate lines formed in a gate layer above the semiconductor substrate, the plurality of gate lines arranged in a first direction and extending in a second direction perpendicular to the second direction; and
    a plurality of metal lines formed in a conduction layer above the gate layer, the plurality of metal lines arranged in the first direction and extending in the second direction, wherein the plurality of metal lines comprise 6N metal lines, the plurality of gate lines comprise 4N gate lines, the 6N metal lines and the 4N gate lines form a unit wiring structure, N is a positive integer, and a plurality of unit wiring structures are arranged in the first direction,
    wherein two metal pitches between every three metal lines sequentially adjacent in the first direction among the plurality of metal lines are different from each other.

2. The integrated circuit of claim 1, wherein the plurality of metal lines are formed by a self-aligned double patterning (SADP) or a self-aligned quadruple patterning (SAQP).

3. The integrated circuit of claim 2, wherein the plurality of gate lines are formed by a single patterning, the SADP or the SAQP.

4. The integrated circuit of claim 1, wherein the unit wiring structure is a minimum unit structure that is not divided into at least two equal sub wiring structures.

5. The integrated circuit of claim 4, wherein each unit wiring structure comprises six metal lines and four gate lines.

6. The integrated circuit of claim 5, wherein the six metal lines of each unit wiring structure are formed by a self-aligned double patterning (SADP), and
    wherein the six metal lines of each unit wiring structure are arranged in the first direction to alternatingly have a first metal pitch and a second metal pitch.

7. The integrated circuit of claim 6, wherein the four gate lines of each unit wiring structure are formed by a single patterning, and
    wherein the four gate lines of each unit wiring structure are arranged in the first direction to have an equal gate pitch.

8. The integrated circuit of claim 6, wherein the four gate lines of each unit wiring structure are formed by an SADP, and
    wherein the four gate lines of each unit wiring structure are arranged in the first direction to alternatingly have a first gate pitch and a second gate pitch.

9. The integrated circuit of claim 6, wherein the four gate lines of each unit wiring structure are formed by a self-aligned quadruple patterning (SAQP), and
    wherein the four gate lines of each unit wiring structure are arranged in the first direction to have a first gate pitch, a second gate pitch, the first gate pitch and a third gate pitch sequentially.

10. The integrated circuit of claim 4, wherein each unit wiring structure comprises twelve metal lines and eight gate lines.

11. The integrated circuit of claim 10, wherein the twelve metal lines of each unit wiring structure are formed by a self-aligned quadruple patterning (SAQP), and
wherein the twelve metal lines of each unit wiring structure are arranged in the first direction to have a first metal pitch, a second metal pitch, the first metal pitch and a third metal pitch sequentially and repeatedly.

12. The integrated circuit of claim 11, wherein the eight gate lines of each unit wiring structure are formed by a single patterning, and
wherein the eight gate lines of each unit wiring structure are arranged in the first direction to have an equal gate pitch.

13. The integrated circuit of claim 11, wherein the eight gate lines of each unit wiring structure are formed by a self-aligned double patterning (SADP), and
wherein the eight gate lines of each unit wiring structure are arranged in the first direction to alternatingly have a first gate pitch and a second gate pitch.

14. The integrated circuit of claim 11, wherein the eight gate lines of each unit wiring structure are formed by the SAQP, and
wherein the eight gate lines of each unit wiring structure are arranged in the first direction to have a first gate pitch, a second gate pitch, the first gate pitch and a third gate pitch sequentially and repeatedly.

15. The integrated circuit of claim 1, wherein:
N=1,
the plurality of unit wiring structures comprises a first unit wiring structure and a second unit wiring structure,
the second unit wiring structure is adjacent to the first unit wiring structure in the first direction, and
a topography of the second unit wiring structure is the same as a topography of the first unit wiring structure.

16. A method of manufacturing an integrated circuit, comprising:
forming a plurality of gate lines in a gate layer above a semiconductor substrate, the plurality of gate lines arranged in a first direction and extending in a second direction perpendicular to the second direction; and
forming a plurality of metal lines in a conduction layer above the gate layer, the plurality of metal lines arranged in the first direction and extending in the second direction, such that 6N metal lines included in the plurality of metal lines and 4N gate lines included in the plurality of gate lines form a unit wiring structure, wherein N is a positive integer and a plurality of unit wiring structures are arranged in the first direction,
wherein two metal pitches between every three metal lines sequentially adjacent in the first direction among the plurality of metal lines are different from each other.

17. The method of claim 16, wherein the plurality of metal lines are formed by a self-aligned double patterning (SADP) or a self-aligned quadruple patterning (SAQP).

18. A method of designing an integrated circuit, comprising:
receiving input data defining an integrated circuit;
providing a standard cell library including a plurality of standard cells;
performing placement and routing based on the input data and the standard cell library; and
generating output data defining the integrated circuit based on a result of the placement and the routing,
wherein the integrated circuit includes:
a semiconductor substrate,
a plurality of gate lines formed in a gate layer above the semiconductor substrate, the plurality of gate lines arranged in a first direction and extending in a second direction perpendicular to the second direction, and
a plurality of metal lines formed in a conduction layer above the gate layer, the plurality of metal lines arranged in the first direction and extending in the second direction, wherein:
6N metal lines of the plurality of metal lines and 4N gate lines of the plurality of gate lines form a unit wiring structure,
N is a positive integer,
a plurality of unit wiring structures are arranged in the first direction, and
two metal pitches between every three metal lines sequentially adjacent in the first direction among the plurality of metal lines are different from each other.

* * * * *